US010134856B2

(12) United States Patent
Eom et al.

(10) Patent No.: US 10,134,856 B2
(45) Date of Patent: Nov. 20, 2018

(54) SEMICONDUCTOR DEVICE INCLUDING CONTACT PLUG AND METHOD OF MANUFACTURING THE SAME

(71) Applicant: Samsung Electronics Co., Ltd., Suwon-si (KR)

(72) Inventors: Da-Il Eom, Goyang-si (KR); Jeong-Ik Kim, Suwon-si (KR); Ja-Hum Ku, Seoul (KR); Chul-Sung Kim, Seongnam-si (KR); Jun-Ki Park, Hwaseong-si (KR); Sang-Jin Hyun, Suwon-si (KR)

(73) Assignee: SAMSUNG ELECTRONICS CO., LTD., Yeongtong-gu, Suwon-si, Gyeonggi-do (KR)

( * ) Notice: Subject to any disclaimer, the term of this patent is extended or adjusted under 35 U.S.C. 154(b) by 0 days.

(21) Appl. No.: 15/254,297

(22) Filed: Sep. 1, 2016

(65) Prior Publication Data

US 2017/0077248 A1 Mar. 16, 2017

(30) Foreign Application Priority Data

Sep. 15, 2015 (KR) .......................... 10-2015-0130205

(51) Int. Cl.
*H01L 29/417* (2006.01)
*H01L 29/78* (2006.01)
(Continued)

(52) U.S. Cl.
CPC .............. *H01L 29/41791* (2013.01); *H01L 21/823821* (2013.01); *H01L 21/845* (2013.01); 
(Continued)

(58) Field of Classification Search
CPC ..... H01L 21/823814; H01L 21/823871; H01L 29/41791
See application file for complete search history.

(56) References Cited

U.S. PATENT DOCUMENTS 6,960,525 B2 11/2005 Chen et al.
8,975,142 B2 * 3/2015 Paul .................. H01L 29/66795
257/288
(Continued)

FOREIGN PATENT DOCUMENTS

JP 2014-067866 A 4/2014
KR 10-2007-0030454 A 3/2007
(Continued)

*Primary Examiner* — Jose R Diaz
(74) *Attorney, Agent, or Firm* — Muir Patent Law, PLLC

(57) ABSTRACT

A semiconductor device includes an active fin partially protruding from an isolation pattern on a substrate, a gate structure on the active fin, a source/drain layer on a portion of the active fin adjacent to the gate structure, a source/drain layer on a portion of the active fin adjacent to the gate structure, a metal silicide pattern on the source/drain layer, and a plug on the metal silicide pattern. The plug includes a second metal pattern, a metal nitride pattern contacting an upper surface of the metal silicide pattern and covering a bottom and a sidewall of the second metal pattern, and a first metal pattern on the metal silicide pattern, the first metal pattern covering an outer sidewall of the metal nitride pattern. A nitrogen concentration of the first metal pattern gradually decreases according to a distance from the outer sidewall of the metal nitride pattern.

18 Claims, 36 Drawing Sheets

(51) Int. Cl.
   *H01L 21/8238* (2006.01)
   *H01L 21/84* (2006.01)
   *H01L 29/66* (2006.01)
   *H01L 27/092* (2006.01)
   *H01L 27/12* (2006.01)

(52) U.S. Cl.
   CPC ...... *H01L 27/0924* (2013.01); *H01L 27/1211* (2013.01); *H01L 29/66545* (2013.01); *H01L 29/785* (2013.01); *H01L 29/7848* (2013.01)

(56) References Cited

U.S. PATENT DOCUMENTS

| | | | |
|---|---|---|---|
| 9,490,365 B2* | 11/2016 | Jangjian | ............... H01L 29/785 |
| 2003/0139027 A1* | 7/2003 | Ikeda | ............... H01L 21/2807 |
| | | | 438/592 |
| 2008/0286965 A1 | 11/2008 | Lee et al. | |
| 2008/0311718 A1 | 12/2008 | Futase | |
| 2010/0151676 A1 | 6/2010 | Ritchie et al. | |
| 2012/0292767 A1 | 11/2012 | Lee et al. | |
| 2016/0336412 A1* | 11/2016 | Hung | ............... H01L 29/41725 |

FOREIGN PATENT DOCUMENTS

| KR | 10-2008-0062017 A | 7/2008 |
|---|---|---|
| KR | 10-2010-0122262 A | 11/2010 |
| KR | 10-2011-0077948 A | 7/2011 |
| KR | 10-2011-0131703 A | 12/2011 |

* cited by examiner

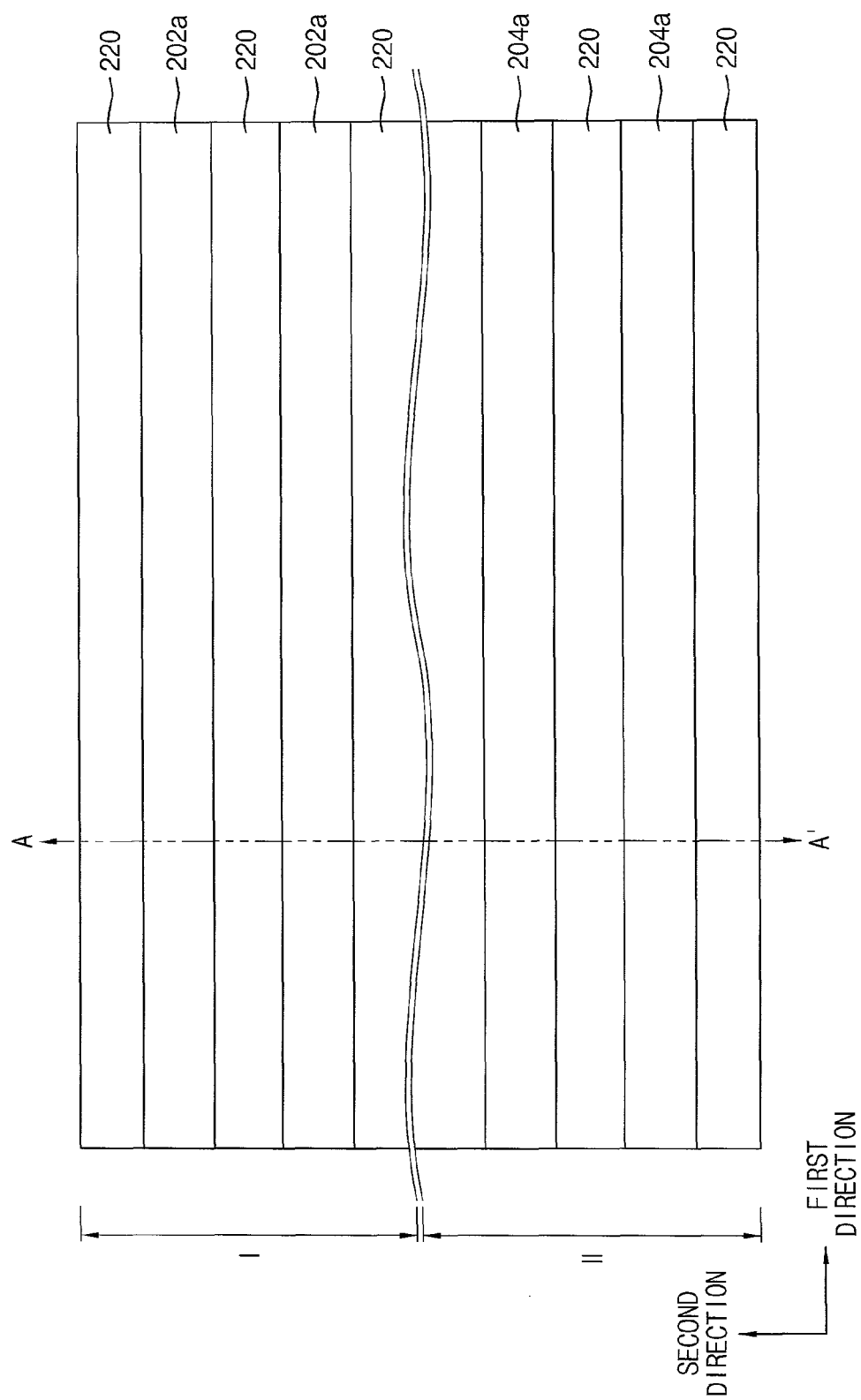

SEMICONDUCTOR DEVICE INCLUDING CONTACT PLUG AND METHOD OF MANUFACTURING THE SAME

CROSS-REFERENCE TO RELATED APPLICATION

This application claims priority under 35 USC § 119 to Korean Patent Application No. 10-2015-0130205, filed on Sep. 15, 2015 in the Korean Intellectual Property Office (KIPO), the contents of which are herein incorporated by reference in their entirety.

BACKGROUND

1. Field

Example embodiments relate to a semiconductor device and a method of manufacturing the same. More particularly, example embodiments relate to a semiconductor device having a contact plug and a method of manufacturing the same.

2. Description of the Related Art

When a tungsten contact plug is formed on a source/drain region of a substrate, a barrier layer may be formed on an inner wall of an opening through an insulating interlayer, a tungsten layer may be formed on the barrier layer and may be planarized. In order to reduce a resistance between the source/drain region and the tungsten contact plug, a heat treatment may be performed on the barrier layer to form a metal silicide layer. However, due to the heat treatment, the characteristics of the barrier layer may be deteriorated.

SUMMARY

Example embodiments provide a semiconductor device including a contact plug having good characteristics.

Example embodiments provide a method of manufacturing a semiconductor device including a contact plug having good characteristics.

According to example embodiments, there is provided a semiconductor device. The semiconductor device may include an active fin partially protruding from an isolation pattern on a substrate, a gate structure on the active fin, a source/drain layer on a portion of the active fin adjacent to the gate structure, a source/drain layer on a portion of the active fin adjacent to the gate structure, a metal silicide pattern on the source/drain layer, and a plug on the metal silicide pattern. The plug may include a second metal pattern, a metal nitride pattern contacting an upper surface of the metal silicide pattern and covering a bottom and a sidewall of the second metal pattern, and a first metal pattern on the metal silicide pattern, the first metal pattern covering an outer sidewall of the metal nitride pattern. The first metal pattern may include a metal nitride, and a nitrogen concentration of the first metal pattern may gradually decrease according to a distance from the outer sidewall of the metal nitride pattern.

In example embodiments, the first metal pattern may include titanium nitride, cobalt nitride or nickel nitride, and the metal nitride pattern may include titanium nitride, tantalum nitride or tungsten nitride. The nitrogen concentration of the first metal pattern may be lower than that of the metal nitride pattern.

In example embodiments, an upper surface of the source/drain layer may not be flat and/or smooth.

In example embodiments, the source/drain layer may fill a recess on a portion of the active fin adjacent to the gate structure and protrudes from the recess, and an uppermost surface of the source/drain layer may be higher than that of the active fin.

In example embodiments, the source/drain layer may include a first source/drain layer including single crystalline silicon-germanium, and a second source/drain layer including single crystalline silicon or single crystalline silicon carbide. An uppermost surface of the second source/drain layer may be higher than that of the first source/drain layer.

In example embodiments, the plug may include a first plug on the first source/drain layer, and a second plug on the second source/drain. A bottom of the second plug may be lower than that of the first plug.

According to example embodiments, there is provided a semiconductor device. The semiconductor device may include a source/drain layer in or on a substrate, a metal silicide pattern on the source/drain layer, and a contact plug on the metal silicide pattern. The contact plug may include a first metal pattern, a metal nitride pattern, and a second metal pattern. The metal nitride pattern may contact an upper surface of the metal silicide pattern, cover a bottom and a sidewall of the second metal pattern, and have a thickness equal to or less than about 3 nm. The first metal pattern may cover an outer sidewall of the metal nitride pattern.

In example embodiments, the second metal pattern may include tungsten.

In example embodiments, the first metal pattern may include titanium, cobalt or nickel, and the metal silicide pattern may include titanium silicide, cobalt silicide or nickel silicide.

In example embodiments, the first metal pattern and the metal silicide pattern may include substantially the same material.

In example embodiments, the metal nitride pattern may include titanium nitride, tantalum nitride or tungsten nitride.

In example embodiments, the source/drain layer may include single crystalline silicon, single crystalline silicon carbide or single crystalline silicon-germanium.

In example embodiments, the first metal pattern may include titanium nitride, cobalt nitride or nickel nitride, and the metal nitride pattern may include titanium nitride, tantalum nitride or tungsten nitride. A nitrogen concentration of the first metal pattern may be lower than that of the metal nitride pattern.

In example embodiments, the nitrogen concentration of the first metal pattern gradually may decrease according to a distance from the outer sidewall of the metal nitride pattern.

In example embodiments, the nitrogen concentration of the first metal pattern at an outer sidewall thereof may be substantially zero.

In example embodiments, a nitrogen concentration of the metal nitride pattern may decrease from a top toward a bottom thereof.

In example embodiments, the metal nitride pattern may further include oxygen.

In example embodiments, an oxygen concentration of the metal nitride pattern may increase from a top toward a bottom thereof.

In example embodiments, a resistance of the metal nitride pattern may increase from a top toward a bottom thereof.

In example embodiments, the first metal pattern may have a thickness about 1 nm to about 10 nm.

In example embodiments, the thickness of the first metal pattern may be less than that of the metal nitride pattern.

In example embodiments, the thickness of the first metal pattern may be greater than that of the metal nitride pattern.

In example embodiments, the semiconductor device may further include an insulating interlayer covering an outer sidewall of the first metal pattern on the substrate.

According to example embodiments, there is provided a semiconductor device. The semiconductor device may include an active fin partially protruding from an isolation pattern on a substrate, a gate structure on the active fin, a source/drain layer on a portion of the active fin adjacent to the gate structure, a metal silicide pattern on the source/drain layer, and a contact plug on the metal silicide pattern. The contact plug may include a second metal pattern, a metal nitride pattern, and a first metal pattern. The metal nitride pattern may contact an upper surface of the metal silicide pattern and cover a bottom and a sidewall of the second metal pattern. The first metal pattern may cover an outer sidewall of the metal nitride pattern. The metal silicide pattern and the first metal pattern may include substantially the same metal.

In example embodiments, the source/drain layer may fill a recess on a portion of the active fin adjacent to the gate structure and protrude from the recess, and an uppermost surface of the source/drain layer may be higher than that of the active fin.

In example embodiments, the semiconductor device may further include a gate spacer covering a sidewall of the gate structure. The source/drain layer may contact an outer sidewall of the gate spacer.

In example embodiments, the gate structure may include a plurality of gate structures disposed in a direction, and the source/drain layer may be formed on a portion of the active fin between neighboring ones of the plurality of gate structures in the direction.

In example embodiments, the semiconductor device may further include a gate spacer covering a sidewall of each of the gate structures. The contact plug may be formed between the gate spacers on sidewalls of neighboring ones of the plurality of gate structures in the direction, and an outer sidewall of the first metal pattern of the contact plug may contact outer sidewalls of the gate spacers.

In example embodiments, the source/drain layer may include a first source/drain layer including single crystalline silicon-germanium, and a second source/drain layer including single crystalline silicon or single crystalline silicon carbide. An uppermost surface of the second source/drain layer may be higher than that of the first source/drain layer.

In example embodiments, the contact plug may include a first contact plug on the first source/drain layer, and a second contact plug on the second source/drain. A bottom of the second contact plug may be lower than that of the first contact plug.

In example embodiments, the gate structure may include a gate electrode and a gate insulation pattern covering a bottom and a sidewall of the gate electrode on the active fin.

In example embodiments, the gate structure may further include an interface pattern between the active fin and the gate insulation pattern, and a work function control pattern between the gate insulation pattern and the gate electrode, which may cover a bottom and a sidewall of the gate electrode.

In example embodiments, the second metal pattern may include tungsten, the first metal pattern includes titanium, cobalt or nickel, the metal silicide pattern may include titanium silicide, cobalt silicide or nickel silicide, and the metal nitride pattern may include titanium nitride, tantalum nitride or tungsten nitride.

In example embodiments, the first metal pattern may include titanium nitride, cobalt nitride or nickel nitride, and the metal nitride pattern may include titanium nitride, tantalum nitride or tungsten nitride. A nitrogen concentration of the first metal pattern may be lower than that of the metal nitride pattern.

In example embodiments, the nitrogen concentration of the first metal pattern gradually may decrease according to a distance from the outer sidewall of the metal nitride pattern.

In example embodiments, a nitrogen concentration of the metal nitride pattern may decrease from a top toward a bottom thereof.

In example embodiments, the metal nitride pattern may have a thickness equal to or less than about 3 nm, and the first metal pattern may have a thickness about 1 nm to about 10 nm.

According to example embodiments, there is provided a method of manufacturing a semiconductor device. In the method, a substrate may be provided. A source/drain layer may be formed in or on the substrate. An insulating interlayer may be formed on the substrate to have an opening exposing an upper surface of the source/drain layer. A first metal layer may be formed on the exposed upper surface of the source/drain layer, a sidewall of the opening and the insulating interlayer. A metal nitride layer may be formed on the first metal layer to have a thickness equal to or less than about 3 nm. A heat treatment process may be performed on the first metal layer to cause the first metal layer to react with the source/drain layer, so that a metal silicide layer may be formed on the source/drain layer between the source/drain layer and the metal nitride layer. A nitridation process may be performed on the metal nitride layer. A second metal layer may be formed on the metal nitride layer to fill a remaining portion of the opening. The second metal layer, the metal nitride layer and the first metal layer may be planarized until an upper surface of the insulating interlayer may be exposed to form a contact plug including a first metal pattern, a metal nitride pattern and a second metal pattern. The first metal pattern may be formed on the sidewall of the opening, the metal nitride pattern may be formed on the metal silicide layer and the first metal pattern, and the second metal pattern may be formed on the metal nitride pattern and filling the remaining portion of the opening. A bottom and a sidewall of the second metal pattern may be covered by the metal nitride pattern.

In example embodiments, when the nitridation process is performed, a plasma nitridation process may be performed on the metal nitride layer.

In example embodiments, when the nitridation process is performed, an annealing process may be performed under an atmosphere of nitrogen or ammonia at a temperature of about 350° C. to about 500° C.

In example embodiments, when the nitridation process is performed, a nitrogen concentration may be increased and an oxygen concentration may be reduced in the metal nitride layer.

In example embodiments, after the nitridation process is performed, a nitrogen concentration of the metal nitride layer may increase from a bottom toward a top thereof.

In example embodiments, when the second metal layer is formed, a CVD process may be performed using tungsten hexafluoride ($WF_6$) as a source gas.

In example embodiments, fluorine generated by the CVD process may be blocked by the metal nitride layer so as not to permeate into the first metal layer.

In example embodiments, the first metal layer may be formed of titanium, cobalt or nickel, and the metal nitride layer may be formed of titanium nitride, tantalum nitride or tungsten nitride.

According to example embodiments, there is provided a method of manufacturing a semiconductor device. In the method, an isolation pattern may be formed on a substrate to define an active fin partially protruding from an upper surface of the isolation pattern. A dummy gate structure may be formed on the active fin. A source/drain layer may be formed on a portion of the active fin adjacent to the dummy gate structure. A first insulating interlayer may be formed on the substrate to cover the source/drain layer and surround a sidewall of the dummy gate structure. The dummy gate structure may be replaced with a gate structure. A second insulating interlayer may be formed on the gate structure and the first insulating interlayer. The first and second insulating interlayers may be partially removed to form a first opening exposing an upper surface of the source/drain layer. A first metal layer may be formed on the exposed upper surface of the source/drain layer, a sidewall of the first opening and the second insulating interlayer. A metal nitride layer may be formed on the first metal layer. A heat treatment process may be performed on the first metal layer to cause the first metal layer to react with the source/drain layer, so that a metal silicide layer may be formed on the source/drain layer between the source/drain layer and the metal nitride layer. A nitridation process may be performed on the metal nitride layer. A second metal layer may be formed on the metal nitride layer to fill a remaining portion of the first opening. The second metal layer, the metal nitride layer and the first metal layer may be planarized until an upper surface of the second insulating interlayer may be exposed to form a contact plug filling the first opening.

In example embodiments, the contact plug may include a first metal pattern on a sidewall of the first opening, a metal nitride pattern on the metal silicide layer and the first metal pattern, and a second metal pattern on the metal nitride pattern. The second metal pattern may fill the remaining portion of the first opening, and a bottom and a sidewall of the second metal pattern may be covered by the metal nitride pattern.

In example embodiments, when the source/drain layer is formed, a recess may be formed on a portion of the active fin adjacent to the gate structure. An SEG process may be performed to form the source/drain layer filling the recess and protruding from the recess. The source/drain layer may have an uppermost surface higher than that of the active fin.

In example embodiments, when the source/drain layer is formed, a first source/drain layer including single crystalline silicon-germanium may be formed. A second source/drain layer including single crystalline silicon or single crystalline carbide may be formed. An uppermost surface of the second source/drain layer may be higher than that of the first source/drain layer.

In example embodiments, when the contact plug is formed, first and second contact plugs may be formed on the first and second source/drain layers, respectively. A bottom of the second contact plug may be higher than that of the first contact plug.

In example embodiments, when the dummy gate structure is replaced with the gate structure, the dummy gate structure may be removed to form a second opening exposing an upper surface of the active fin. A gate insulation layer may be formed on the exposed upper surface of the active fin, a sidewall of the second opening and the first insulating interlayer. A gate electrode layer may be formed on the gate insulation layer to fill a remaining portion of the second opening. The gate electrode layer and the gate insulation layer may be planarized until an upper surface of the first insulating interlayer may be exposed to form the gate structure including a gate insulation pattern and a gate electrode. The gate insulation pattern may be formed on the exposed upper surface of the active fin and the sidewall of the second opening, and the gate electrode may be formed on the gate insulation pattern and filling the remaining portion of the second opening. A bottom and a sidewall of the gate electrode may be covered by the gate insulation pattern.

A metal nitride pattern of a contact plug in accordance with example embodiments may have a thin thickness equal to or less than about 3 nm, and thus a second metal pattern in the contact plug, which may have a resistance lower than that of the metal nitride pattern, may have a relatively large volume. Since the metal nitride pattern may have an increased nitrogen concentration due to a nitridation process, the metal nitride pattern may have a resistance lower than that of a metal nitride pattern on which no nitridation process is performed. Accordingly, the contact plug including the metal nitride pattern and the second metal pattern may have a low resistance.

Even if the metal nitride pattern has a thin thickness, it may have the enhanced barrier characteristics by the nitridation process, and thus the second metal pattern may be compactly formed with no void therein. Additionally, an amount of fluorine permeating into a first metal pattern in the contact plug may be very small, and no void or seam may be formed in an interface between the first metal pattern and an insulating interlayer surrounding the first metal pattern. Accordingly, the contact plug including the first and second metal patterns may have good characteristics.

According to example embodiments, there is provided a method of manufacturing a semiconductor device. The method may include forming a source/drain layer in or on a substrate, forming an insulating layer on the substrate, the insulating layer having an opening exposing an upper surface of the source/drain layer, forming a first metal layer on the exposed upper surface of the source/drain layer, a top portion of the insulating layer, and a sidewall of the opening, forming a metal nitride layer on the first metal layer, performing a heat treatment process to form a metal silicide layer on the source/drain layer between the source/drain layer and the metal nitride layer, performing a nitridation process to nitridate the metal nitride layer, a first portion of the first metal layer, and a second portion of the metal silicide layer, forming a second metal layer on the metal nitride layer to fill the opening, and planarizing the second metal layer, the metal nitride layer and the first metal layer until an upper surface of the insulating layer is exposed to form a contact plug filling the opening.

BRIEF DESCRIPTION OF THE DRAWINGS

Example embodiments will be more clearly understood from the following detailed description taken in conjunction with the accompanying drawings. FIGS. 1 to 40 represent non-limiting, example embodiments as described herein.

FIGS. 1 to 6, 7A, and 7B are cross-sectional views illustrating stages of a method of manufacturing a semiconductor device including a contact plug according to example embodiments; and FIGS. 8 to 37, 38A, 38B, 39, and 40 are plan views and cross-sectional views illustrating stages of a method of manufacturing a semiconductor device in accordance with example embodiments.

DETAILED DESCRIPTION

Figure 1:
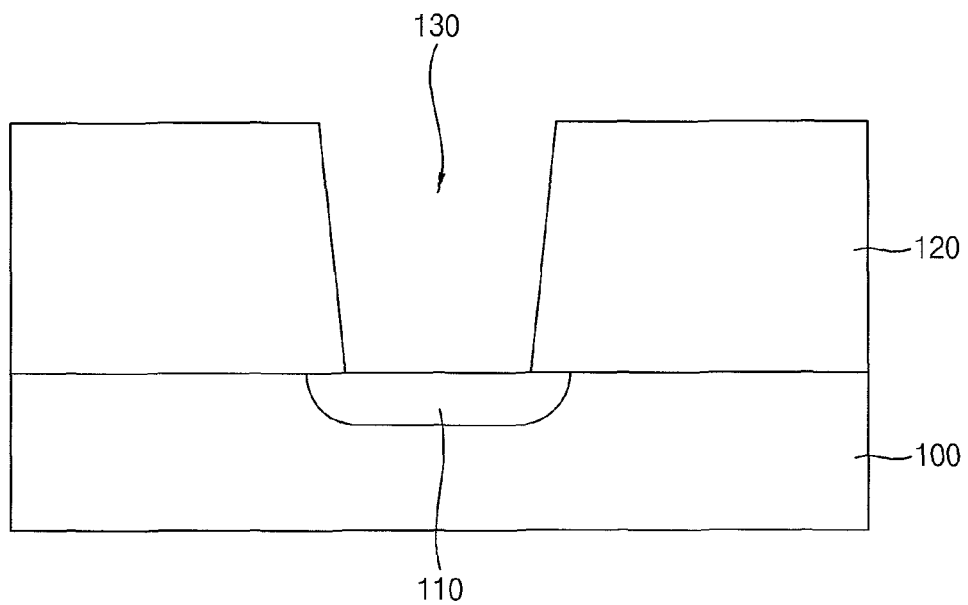

Various example embodiments will be described more fully hereinafter with reference to the accompanying drawings, in which some example embodiments are shown. The present disclosure may, however, be embodied in many different forms and should not be construed as limited to the example embodiments set forth herein. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. The term "contacting" refers to a direct connection (i.e., touching), unless the context indicates otherwise. Like numerals refer to like elements throughout. As used herein, the term "and/or" includes any and all combinations of one or more of the associated listed items.

It will be understood that, although the terms first, second, third, fourth etc. may be used herein to describe various elements, components, regions, layers and/or sections, these elements, components, regions, layers and/or sections should not be limited by these terms. Unless indicated otherwise, these terms are only used to distinguish one element, component, region, layer or section from another region, layer or section. Thus, a first element, component, region, layer or section discussed below could be termed a second element, component, region, layer or section without departing from the teachings of the present inventive concept. Expressions such as "at least one of" when preceding a list of elements, modify the entire list of elements and do not modify the individual elements of the list.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of the present disclosure. As used herein, the singular forms "a," "an" and "the" are intended to include the plural forms as well, unless the context clearly indicates otherwise. It will be further understood that the terms "comprises," "comprising," "includes," and/or "including," when used in this specification, specify the presence of stated features, integers, steps, operations, elements, and/or components, but do not preclude the presence or addition of one or more other features, integers, steps, operations, elements, components, and/or groups thereof.

Unless the context indicates otherwise, terms such as "same," "equal," "planar," or "coplanar," as used herein when referring to orientation, layout, location, shapes, sizes, amounts, or other measures do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes. The term "substantially" may be used herein to reflect this meaning. For example, items described as "substantially the same," "substantially equal," or "substantially planar," may be exactly the same, equal, or planar, or may be the same, equal, or planar within acceptable variations that may occur, for example, due to manufacturing processes.

Example embodiments are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to limit the scope of the present disclosure.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIGS. 1 to 6, 7A, and 7B are cross-sectional views illustrating stages of a method of manufacturing a semiconductor device including a contact plug according to example embodiments.

As used herein, a semiconductor device may refer, for example, to a device such as a semiconductor chip (e.g., memory chip and/or logic chip formed from a wafer), a stack of semiconductor chips, a semiconductor package including one or more semiconductor chips stacked on a package substrate, or a package-on-package device including a plurality of packages.

Referring to FIG. 1, a source/drain layer 110 may be formed in a substrate 100, an insulating interlayer 120 covering the substrate 100 and the source/drain layer 110 may be formed, and an opening 130 may be formed through the insulating interlayer 120 to expose an upper surface of the source/drain layer 110. In some embodiments, "in" may refer to a source/drain region buried in the substrate, and "on" may refer to a source/drain region above the substrate. A source/drain region described as "provided with" a substrate may be formed in or on the substrate.

The substrate 100 may include a semiconductor material, e.g., silicon, germanium, silicon-germanium, or III-V semiconductor compounds, e.g., GaP, GaAs, GaSb, etc. In an example embodiment, the substrate 100 may be a silicon-on-insulator (SOI) substrate or a germanium-on-insulator (GOI) substrate.

Various types of elements, e.g., a gate structure, an isolation pattern, etc. may be formed on the substrate 100, and may be covered by the insulating interlayer 120.

In example embodiments, the source/drain layer 110 may be formed by implanting impurities into an upper portion of the substrate 100. The impurities may include p-type impurities, e.g., boron, aluminum, etc., or n-type impurities, e.g., phosphorus, arsenic, etc.

Alternatively, the source/drain layer 110 may be formed by forming a recess (not shown) on the substrate 100, and performing a selective epitaxial growth (SEG) process using a portion of the substrate 100 under the recess as a seed to fill the recess. The SEG process may be formed using a silicon source gas, e.g., dichlorosilane ($SiH_2Cl_2$) gas, and a germanium source gas, e.g., germane ($GeH_4$) gas, and a single crystalline silicon-germanium layer may be formed. A p-type impurity source gas, e.g., diborane ($B_2H_6$) gas may be also used to form a single crystalline silicon-germanium layer doped with p-type impurities. Alternatively, the SEG process may be performed using a silicon source gas, e.g., disilane ($Si_2H_6$) gas and a carbon source gas, e.g., monomethylsilane ($SiH_3CH_3$) gas, and a single crystalline silicon carbide layer may be formed. Alternatively, the SEG process may be performed using only a silicon source gas, e.g., disilane ($Si_2H_6$) gas, and a single crystalline silicon layer may be formed. An n-type impurity source gas, e.g., phosphine ($PH_3$) gas may be also used to form a single crystalline silicon carbide layer doped with n-type impurities or a single crystalline silicon layer doped with n-type impurities.

When the source/drain layer 110 is formed by an SEG process, an upper surface of the source/drain layer 110 may be substantially coplanar with or higher than an upper surface of the substrate 100.

The insulating interlayer 120 may be formed of, e.g., silicon oxide. Alternatively, the insulating interlayer 120 may be formed of a low-k dielectric material, e.g., silicon oxide doped with carbon (SiCOH) or silicon oxide doped with fluorine (F—$SiO_2$), a porous silicon oxide, spin on organic polymer, or an inorganic polymer, e.g., hydrogen silsesquioxane (HSSQ), methyl silsesquioxane (MSSQ), etc.

The opening 130 may be formed by forming a photoresist pattern (not shown) on the insulating interlayer 120, and performing an etching process using the photoresist pattern as an etching mask. The opening 130 may be formed through the insulating interlayer 120.

Figure 2:
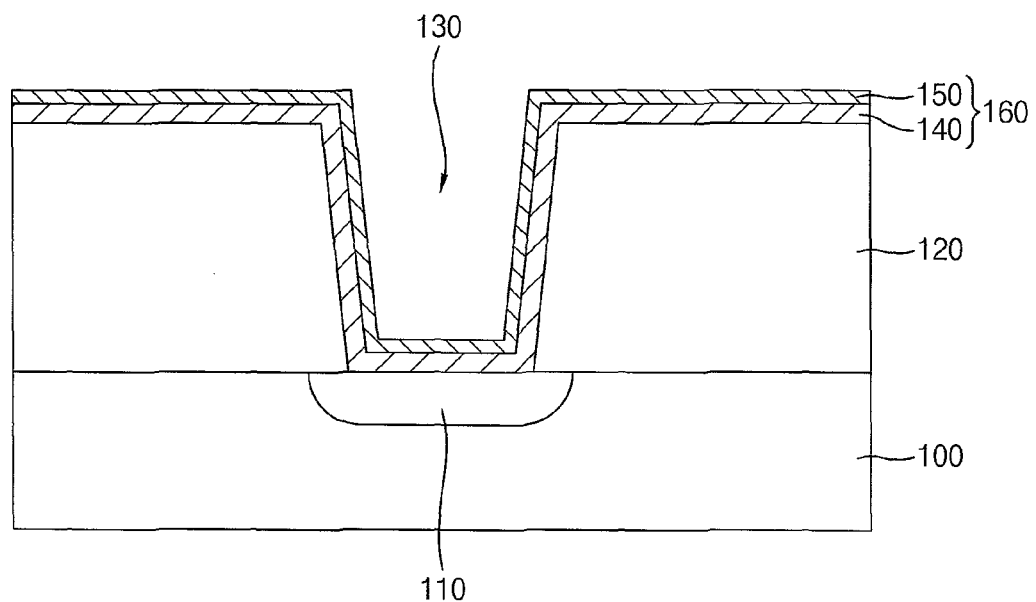

Referring to FIG. 2, a first metal layer 140 and a metal nitride layer 150 may be sequentially formed on the exposed upper surface of the source/drain layer 110, a sidewall of the opening 130, and an upper surface of the insulating interlayer 120. The first metal layer 140 and the metal nitride layer 150 sequentially stacked may form a barrier layer 160.

The first metal layer 140 may be formed of a material such as titanium, cobalt, nickel, etc., that may be reacted with the source/drain layer 110 to form a metal silicide. The first metal layer 140 may be formed to have a thickness of, e.g., about 1 nm to about 10 nm. In example embodiments, the first metal layer 140 may be conformally formed to have a constant thickness.

Figure 3:
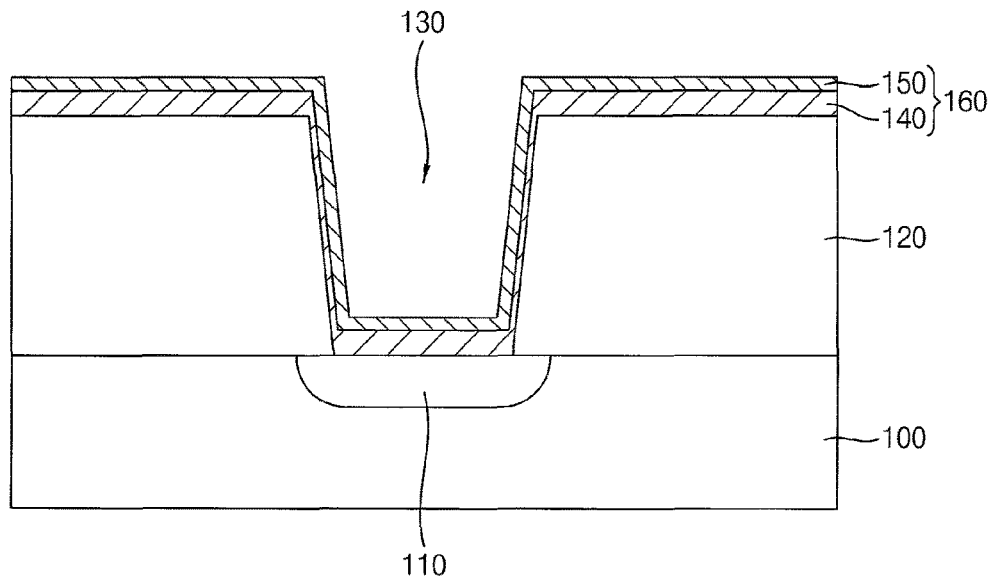

Alternatively, referring to FIG. 3, the first metal layer 140 may be formed to have a varying thickness. In example embodiments, portions of the first metal layer 140 on the exposed upper surface of the source/drain layer 110 and the upper surface of the insulating interlayer 120 may have thicknesses of about 5 nm to about 10 nm, and the portion of the first metal layer 140 on the sidewall of the opening 130 may have a thickness of about 1 nm.

Hereinafter, for the convenience of explanation, only the first metal layer 140 having the constant thickness will be illustrated. The metal nitride layer 150 may be formed to have a thin thickness of equal to or less than about 3 nm. In example embodiments, the metal nitride layer 150 may be conformally formed to have a constant thickness.

In an example embodiment, as shown in FIG. 2, the metal nitride layer 150 may be formed to have a thickness less than that of the first metal layer 140. Alternatively, the metal nitride layer 150 may be formed to have a thickness that may be less than those of the portions of the first metal layer 140 on the exposed upper surface of the source/drain layer 110 and the upper surface of the insulating interlayer 120 and that may be greater than that of the portion of the first metal layer 140 on the sidewall of the opening 130. In example embodiments, the metal nitride layer 150 may be formed of, for example, titanium nitride, tantalum nitride or tungsten nitride.

In example embodiments, the first metal layer 140 and the metal nitride layer 150 may be formed by a chemical vapor deposition (CVD) process, an atomic layer deposition (ALD) process, a physical vapor deposition (PVD) process, etc.

Figure 4:
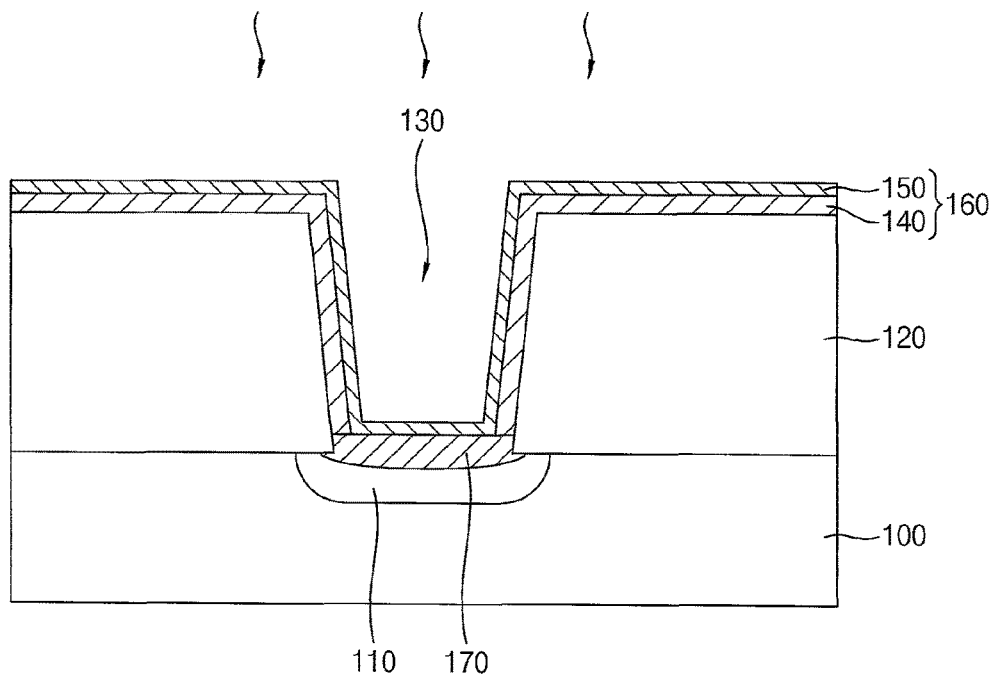

Referring to FIG. 4, a heat treatment process may be performed on the substrate 100 having the first metal layer 140 and the metal nitride layer 150 thereon to form a metal silicide pattern 170.

In example embodiments, an annealing process (e.g., by using laser, ramp, or furnace etc.) may be performed on the substrate 100, and thus the source/drain layer 110 and the first metal layer 140 may be reacted with each other to form the metal silicide pattern 170. The laser annealing process may be performed at a temperature of about 800° C. for several seconds. In example embodiments, the metal silicide pattern 170 may be formed of a material such as titanium silicide, cobalt silicide or nickel silicide, etc.

The portions of the first metal layer 140 on the sidewall of the opening 130 and the upper surface of the insulating interlayer 120 may not be reacted with the source/drain layer 110 so that the portions of the first metal layer 140 on the sidewall of the opening 130 and the upper surface of the insulating interlayer 120 may remain with no reacting with the source/drain layer 110.

Due to the heat treatment process, the characteristics of the metal nitride layer 150 may be deteriorated. A metal element of the metal nitride layer 150 may be combined with oxygen during, before or after the heat treatment process, and thus an oxygen concentration in the metal nitride layer 150 may increase while a nitrogen concentration therein may decrease.

As a result, when a second metal layer 180 (refer to FIG. 6) is formed on the metal nitride layer 150, the metal nitride layer 150 may not sufficiently serve as nucleus for forming the second metal layer 180, and thus the second metal layer 180 may not be formed compactly and defects (e.g., void, volcano, delamination or seam, etc.) may be formed therein.

Fluorine that may be generated during the formation of the second metal layer 180 may penetrate through the metal nitride layer 150 to permeate into the first metal layer 140, and thus defects such as void or delamination may be generated in, for example, the first metal layer 140, the metal nitride layer 150, the second metal layer 180, an interface between the second metal layer 180 and the metal nitride layer 150, an interface between the first metal layer 140 and the metal nitride layer 150, or an interface between the first metal layer 140 and the insulating interlayer 120.

Further, since the oxygen concentration in the metal nitride layer 150 increases, a resistance of the metal nitride layer 150 may increase.

Particularly, when the metal nitride layer 150 has the thin thickness of equal to or less than about 3 nm, the barrier characteristics of the metal nitride layer 150 may be much deteriorated.

Figure 5:
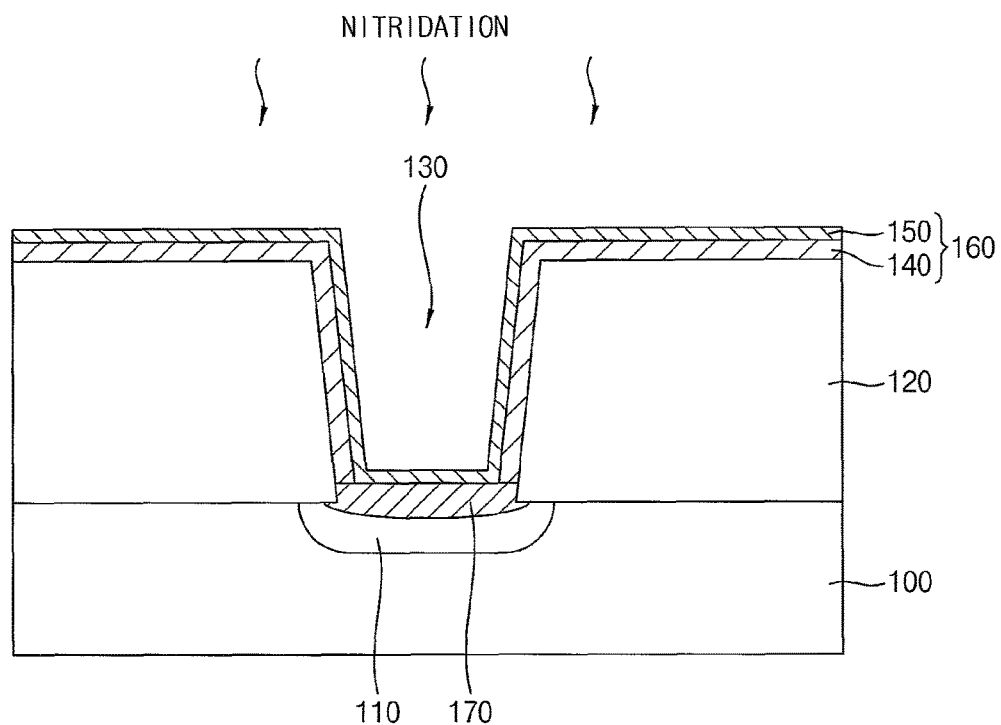

In example embodiments, referring to FIG. 5, a nitridation process may be performed on the metal nitride layer 150, and the barrier characteristics of the metal nitride layer 150 deteriorated by the heat treatment process may be enhanced. In example embodiments, the nitridation process may be performed to further nitridate a first portion of the first metal layer 140 and a second portion of the metal silicide pattern 170. For example, the first portion of the first metal layer 140 may include a top portion of the first metal layer 140 disposed on the insulating interlayer 120 and an inner portion of the first metal layer 140 in the opening 130. The second portion of the metal silicide pattern 170 may include a top portion of the metal silicide pattern 170 in the opening 130.

In example embodiments, the nitridation process may include a plasma nitridation (PN) process. Alternatively, the nitridation process may include an annealing process under an atmosphere of nitrogen or ammonia at about 350° C. to about 500° C. In example embodiments, the nitridation process may be performed in more severe condition such as a higher temperature, a longer time period, or a higher electric power than normal to further nitridate the first portion of the first metal layer 140, and the second portion of the metal silicide pattern 170. Thus, the element (e.g., titanium) in the metal silicide layer not reacted with the source/drain layer 110 may be nitridated.

Due to the nitridation process, oxygen combined with the metal element in the metal nitride layer 150 may be replaced with nitrogen, and thus the oxygen concentration in the metal nitride layer 150 may decrease while the nitrogen concentration therein may increase. As a result, the barrier characteristics may be enhanced, which may be illustrated again with reference to FIG. 6. Due to the nitridation process, the resistance of the metal nitride layer 150 increased by the heat treatment process may decrease.

In an example embodiment, due to the nitridation process, nitrogen may be combined with a metal element in the first metal layer 140 under the metal nitride layer 150, and thus the first metal layer 140 may also include nitrogen. For example, a nitrogen concentration in the first metal layer 140 may be lower than that of the metal nitride layer 150, and may gradually decrease according to a distance from the metal nitride layer 150. In an example embodiment, the nitrogen concentration of the first metal layer 140 may be highest at the interface with the metal nitride layer 150, and may gradually decrease according to a distance therefrom to zero at an interface with the insulating interlayer 120.

When an aspect ratio (AR) of the opening 130 is high, an amount of nitrogen implanted by the nitridation process into the metal nitride layer 150 may vary according to position thereof. In an example embodiment, an amount of nitrogen implanted into a portion of the metal nitride layer 150 on an upper surface of the metal silicide pattern 170 or adjacent to a bottom of the opening 130 may be less than an amount of nitrogen implanted into a portion of the metal nitride layer 150 on the upper surface of the insulating interlayer 120 or adjacent to an inlet of the opening 130. The nitrogen concentration of the metal nitride layer 150 may decrease from a top toward a bottom thereof. For example, the bottom of the metal nitride layer 150 contacts the first metal layer 140 or the metal silicide pattern 170, and the top of the metal nitride layer 150 is opposite to the bottom of the metal nitride layer 150. In example embodiments, an oxygen concentration and a resistance of the metal nitride layer 150 may increase from the top toward the bottom thereof.

In example embodiments, a nitrogen concentration of the first metal layer 140 may gradually decrease with respect to a distance from an interface between the first metal layer 140 and the metal nitride layer 150 after the nitridation process. Also, a nitrogen concentration of the metal silicide layer 170 may gradually decrease with respect to a distance from an interface between the metal silicide layer 170 and the metal nitride layer 150 after the nitridation process.

In example embodiments, the heat treatment process and the nitridation process may be performed simultaneously to reduce process steps. For example, the heat treatment process and the nitridation process may be performed at a temperature of about 800° C. for several seconds.

Figure 6:
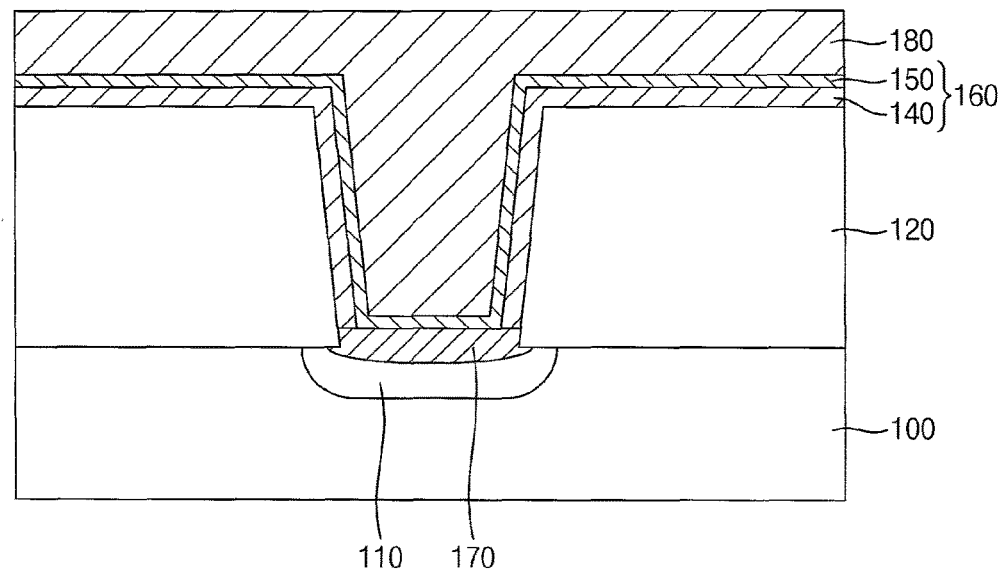

Referring to FIG. 6, the second metal layer 180 may be formed on the metal nitride layer 150 to fill a remaining portion of the opening 130.

The second metal layer 180 may be formed of, e.g., tungsten by a CVD process, an ALD process, a PVD process, etc.

In example embodiments, the second metal layer 180 may be formed by a CVD process using tungsten hexafluoride ($WF_6$). Fluorine generated from tungsten hexafluoride ($WF_6$) in the CVD process may be mostly blocked by the metal nitride layer 150 having the enhanced barrier characteristics even with the thin thickness of equal to or less than about 3 nm, and thus only a very small amount of fluorine may permeate into the first metal layer 140. Accordingly, no defects such as void or delamination may be formed in, for example, the first metal layer 140, the metal nitride layer 150, the interface between the second metal layer 180 and the metal nitride layer 150, or the interface between the first metal layer 140 and the insulating interlayer 120.

The metal nitride layer 150 having the high nitrogen concentration may serve as nucleus for forming a tungsten layer, and thus the tungsten layer may be compactly formed with no void or seam therein.

Figure 7A:
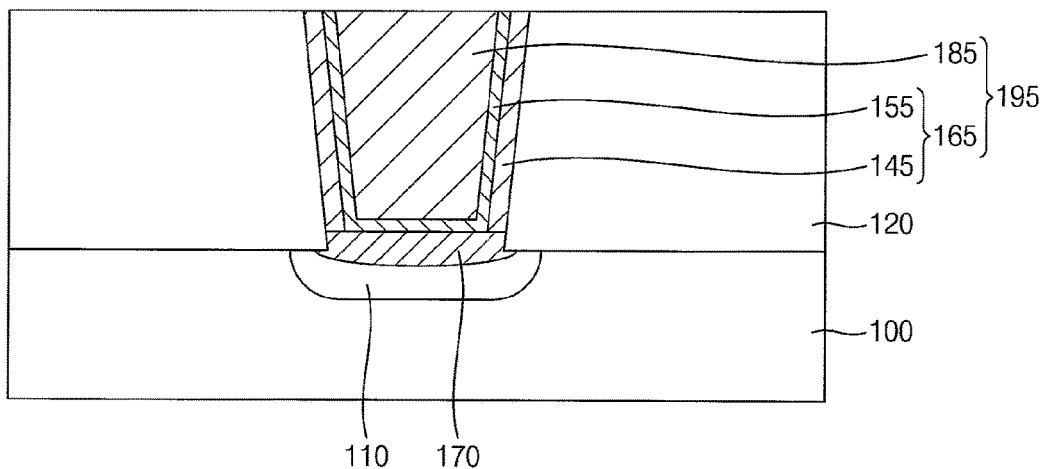

Referring to FIG. 7A, the second metal layer 180, the metal nitride layer 150 and the first metal layer 140 may be planarized until the upper surface of the insulating interlayer 120 may be exposed to form a second metal pattern 185, a metal nitride pattern 155 and a first metal pattern 145, respectively.

The metal nitride pattern 155 may contact the upper surface of the metal silicide pattern 170, and may cover a bottom and a sidewall of the second metal pattern 185. The first metal pattern 145 may contact the upper surface of the metal silicide pattern 170, and may cover an outer sidewall of the metal nitride pattern 155.

The first metal pattern 145 and the metal nitride pattern 155 may form a barrier pattern 165, and the barrier pattern 165 and the second metal pattern 185 may form a plug 195 (hereinafter, a plug may be referred to as a contact plug). The plug 195 may be formed on the metal silicide pattern 170, and may fill the opening 130. In one embodiment, the plug 195 may include the barrier pattern 165, the second metal pattern 185, and the metal silicide pattern 170.

As illustrated above, the metal nitride pattern 155 of the plug 195 in accordance with example embodiments may have the thin thickness of equal to or less than about 3 nm, and thus the second metal pattern 185 having a resistance lower than that of the metal nitride pattern 155 may have a relatively large volume. Since the metal nitride pattern 155 may have the increased nitrogen concentration due to the nitridation process, the metal nitride pattern 155 may have a resistance lower than that of a metal nitride pattern on which no nitridation process is performed. Accordingly, the plug 195 including the metal nitride pattern 155 and the second metal pattern 185 may have a low resistance.

According to embodiments disclosed herein, even if the metal nitride pattern 155 has a thin thickness, it may have the enhanced barrier characteristics by the nitridation process, and thus the second metal pattern 185 may be compactly formed with no defects therein. Additionally, the amount of fluorine permeating into the first metal pattern 145 may be very small, and no defects such as void or seam may be formed in, for example, the first metal pattern 145, the metal nitride pattern 155, an interface between the first metal pattern 145 and the metal nitride pattern 155, or an interface between the first metal pattern 145 and the insulating interlayer 120. Accordingly, the plug 195 including the first and second metal patterns 145 and 185 may have good characteristics.

Figure 7B:
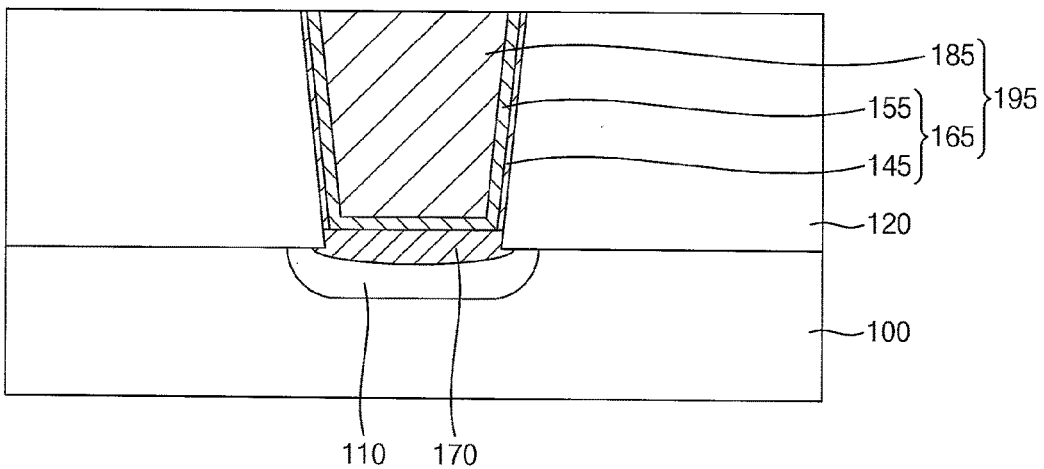

FIG. 7A shows that the first metal pattern 145 on the sidewall of the opening 130 has a thickness greater than that of the metal nitride pattern 155. Alternatively, FIG. 7B shows that the first metal pattern 145 on the sidewall of the opening 130 has a thickness less than that of the metal nitride pattern 155, which may be also included in the scope of the present invention.

FIGS. 8 to 37, 38A, 38B, 39, and 40 are plan views and cross-sectional views illustrating stages of a method of manufacturing a semiconductor device in accordance with example embodiments. Particularly, FIGS. 8, 11, 14, 17, 20, 25, 28, 31 and 36 are plan views, and FIGS. 9, 10, 12, 13, 15, 16, 18, 19, 21-24, 26, 27, 29, 30, 32-35 and 37, 38A, 38B, 39, and 40 are cross-sectional views.

FIGS. 9, 10, 12 and 29 are cross-sectional views taken along lines A-A' of corresponding plan views, respectively, FIGS. 13, 15, 18, 21, 22, 26, 30, 32, 34, 37, 39 and 40 are cross-sectional views taken along lines B-B' of corresponding plan views, respectively, and FIGS. 16, 19, 23, 24, 27, 33, 35, 38A, and 38B are cross-sectional views taken along lines C-C' of corresponding plan views, respectively.

In example embodiments, the method of manufacturing the semiconductor device may include processes substantially the same as or similar to those illustrated with reference to FIGS. 1 to 6, 7A and 7B, and thus detailed descriptions thereon may be omitted herein.

Figure 9:
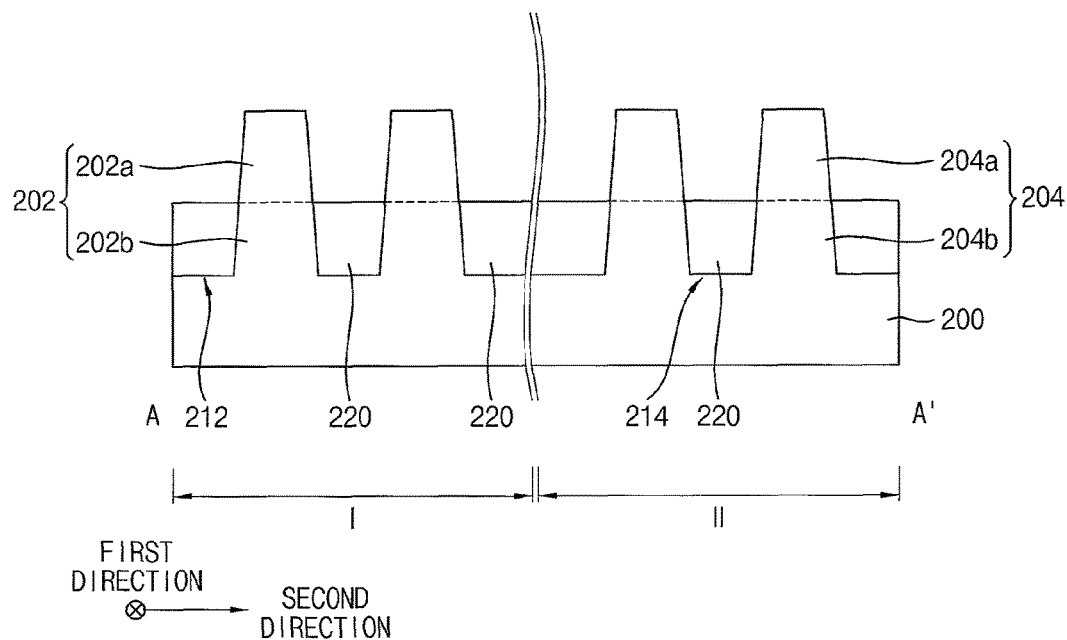

Referring to FIGS. 8 and 9, upper portions of a substrate 200 may be partially removed to form first and second recesses 212 and 214, respectively, and an isolation pattern 220 may be formed to fill a lower portion of each of the first and second recesses 212 and 214.

The substrate 200 may include first and second regions I and II. In example embodiments, the first and second regions I and II may be a P-type metal oxide semiconductor (PMOS) and a N-type metal oxide semiconductor (NMOS) regions, respectively. The first and second recesses 212 and 214 may be formed at upper portions of the first and second regions I and II, respectively, of the substrate 200.

In example embodiments, the isolation pattern 220 may be formed by forming an isolation layer on the substrate 200 to sufficiently fill the first and second recesses 212 and 214, planarizing the isolation layer until an upper surface of the substrate 200 may be exposed, and removing upper portions of the isolation layer to expose upper portions of the first and second recesses 212 and 214, respectively. The isolation layer may be formed of an oxide, e.g., silicon oxide.

As the isolation pattern 220 may be formed on the substrate 200, a field region having a top surface covered by the isolation pattern 220 and first and second active regions 202 and 204 having top surfaces not covered by the isolation pattern 220 may be defined in the first and second regions I and II, respectively, of the substrate 200. Each of the first and second active regions 202 and 204 may have a fin-like shape protruding from the substrate 200, and thus may be referred to as first and second active fins, respectively.

In example embodiments, each of the first and second active fins 202 and 204 may be formed to extend in a first direction substantially parallel to an upper surface of the substrate 200, and a plurality of first active fins 202 and a plurality of second active fins 204 may be formed in a second direction substantially parallel to the upper surface of the substrate 200 and substantially perpendicular to the first direction.

In example embodiments, the first active fin 202 may include a first lower active pattern 202b of which a sidewall may be covered by the isolation pattern 220, and a first upper active pattern 202a protruding from an upper surface of the isolation pattern 220. Additionally, the second active fin 204 may include a second lower active pattern 204b of which a sidewall may be covered by the isolation pattern 220, and a second upper active pattern 204a protruding from the upper surface of the isolation pattern 220. In example embodiments, each of the first and second upper active patterns 202a and 204a may have a width in the second direction slightly smaller than a width of each of the first and second lower active patterns 202b and 204b in the second direction.

Figure 10:
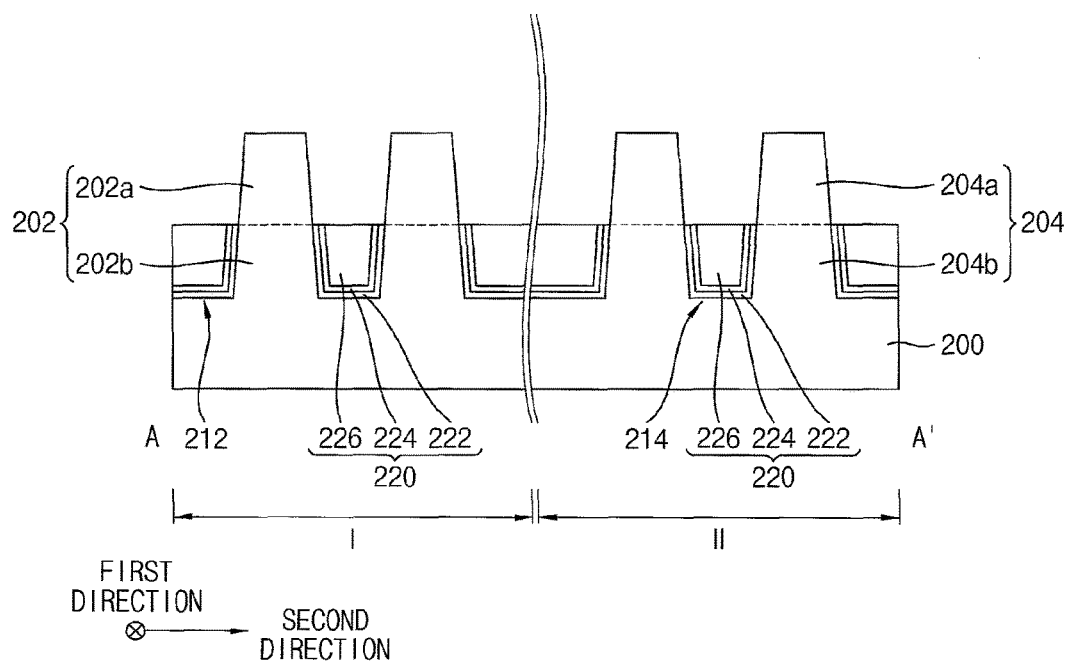

Referring to FIG. 10, the isolation pattern 220 may have a multiple layer structure.

Particularly, the isolation pattern 220 may include first and second liners 222 and 224 sequentially stacked on an inner wall of each of the first and second recesses 212 and 214, and an insulation layer 226 filling a remaining portion of each of the first and second recesses 212 and 214 on the second liner 224.

The first liner 222 may be formed of an oxide, e.g., silicon oxide, and the second liner 224 may be formed of polysilicon or a nitride, e.g., silicon nitride. The insulation layer 226 may be formed of an oxide, e.g., silicon oxide.

Figure 11:
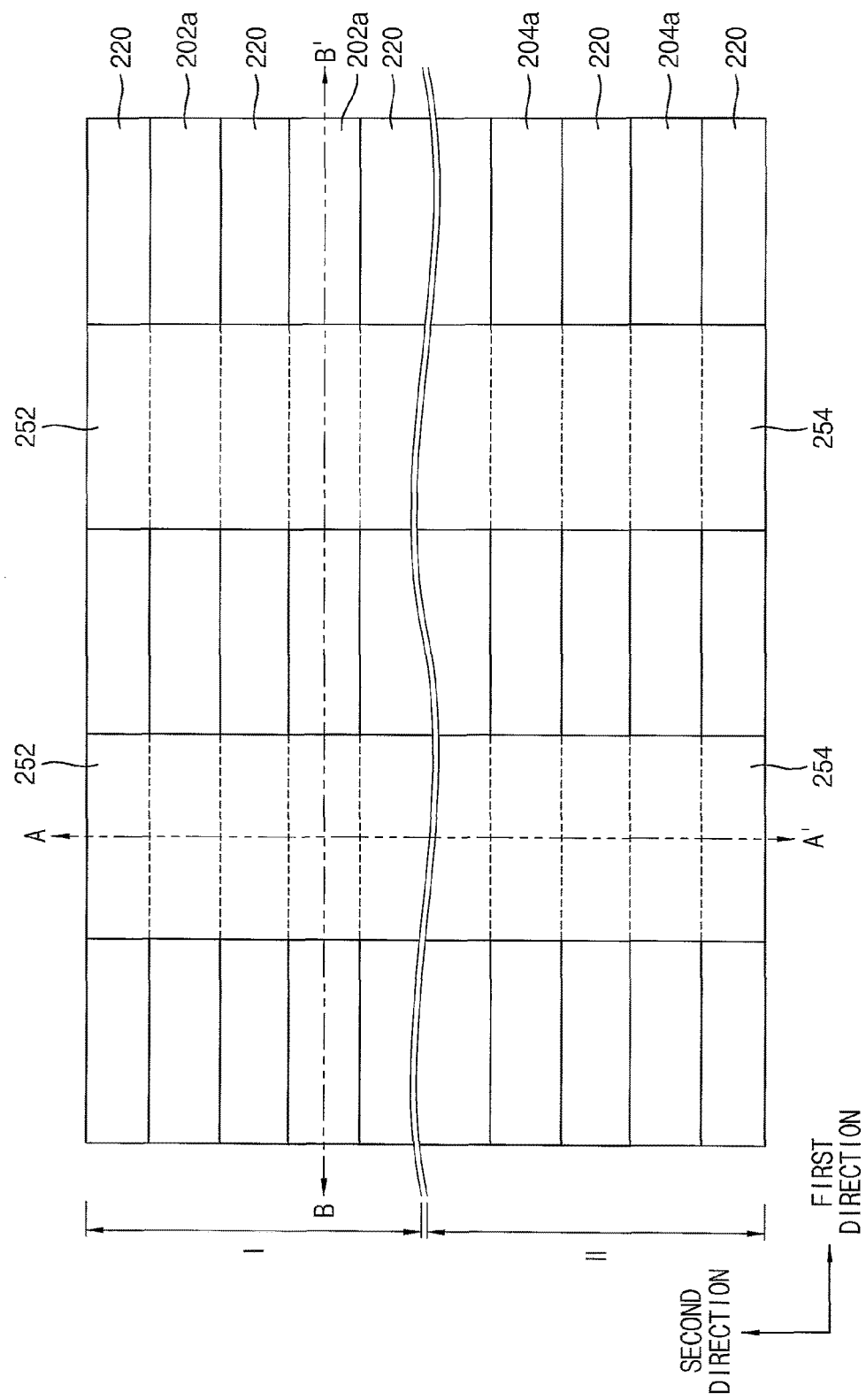
Figure 12:
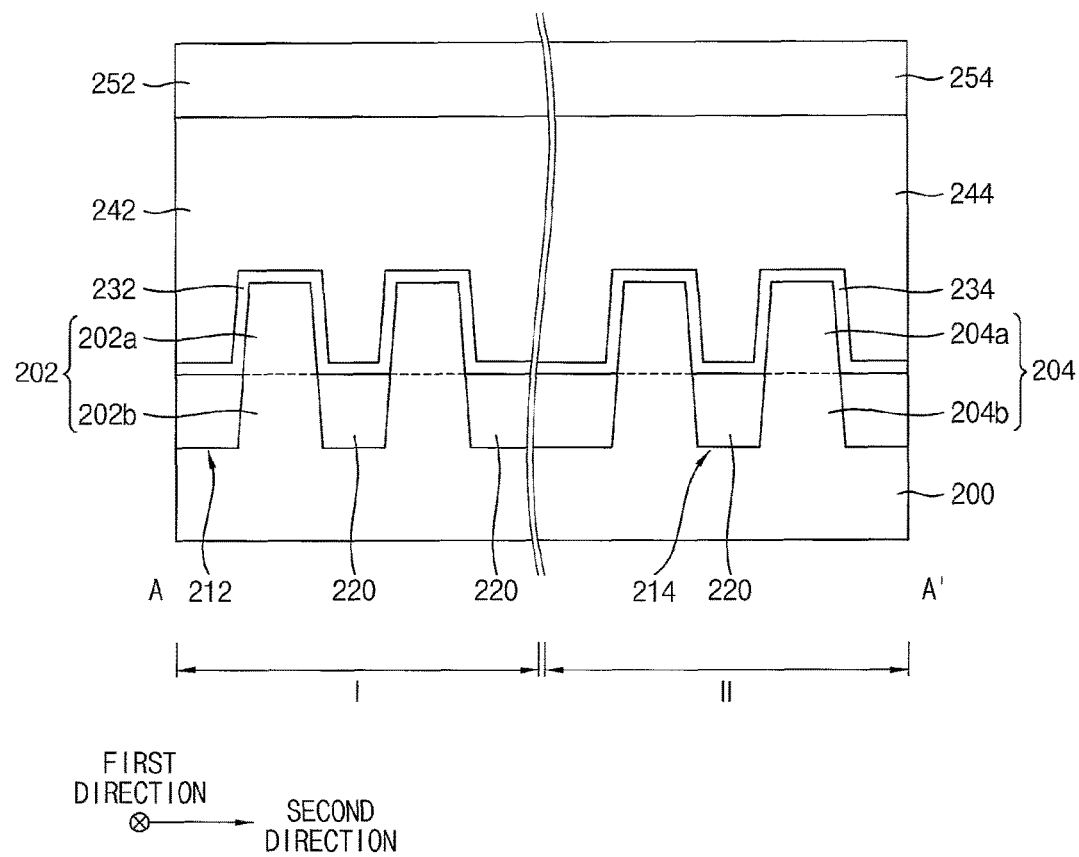
Figure 13:
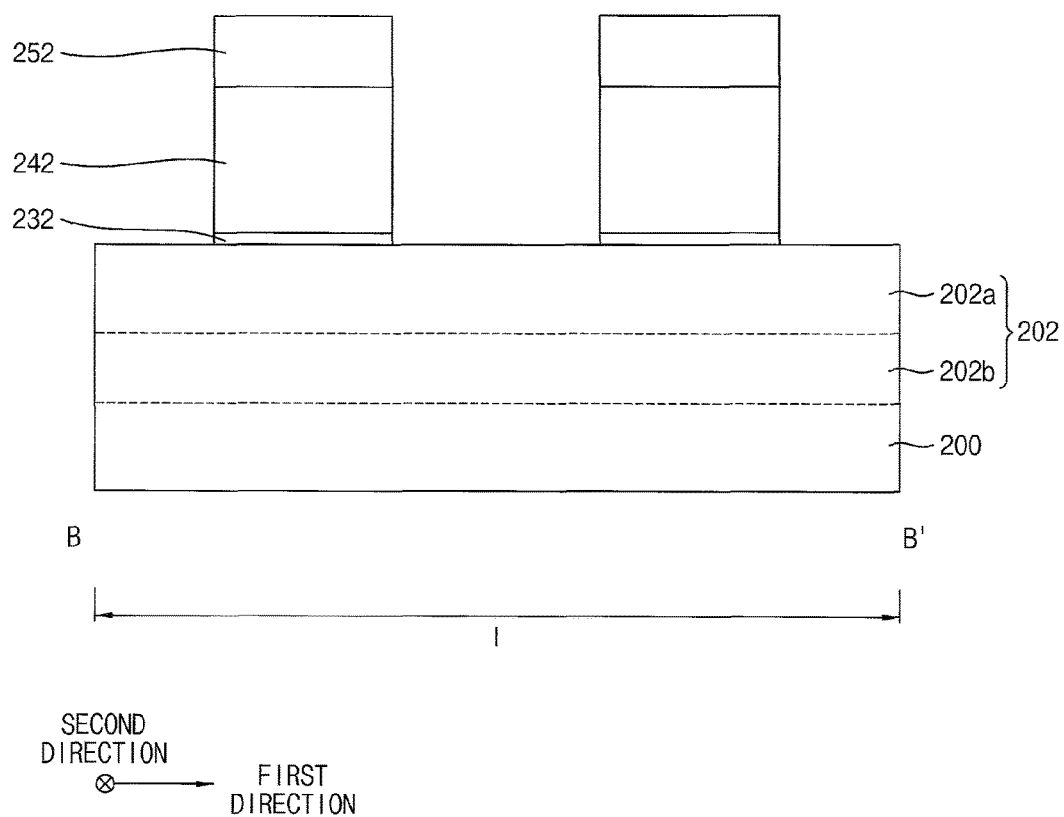

Referring to FIGS. 11 to 13, first and second dummy gate structures may be formed on the first and second regions I and II, respectively, of the substrate 200.

The first and second dummy gate structures may be formed by sequentially forming a dummy gate insulation layer, a dummy gate electrode layer, and a dummy gate mask layer on the first and second active fins 202 and 204 of the substrate 200 and on the isolation pattern 220, patterning the dummy gate mask layer by a photolithography process using a photoresist pattern (not shown) to form first and second dummy gate masks 252 and 254, and sequentially etching the dummy gate electrode layer and the dummy gate insulation layer using the first and second dummy gate masks 252 and 254 as an etching mask. Thus, the first dummy gate structure may be formed to include a first dummy gate insulation pattern 232, a first dummy gate electrode 242 and the first dummy gate mask 252 sequentially stacked on the first active fin 202 of the substrate 200 and a portion of the isolation pattern 220 adjacent to the first active fin 202 in the second direction. The second dummy gate structure may be formed to include a second dummy gate insulation pattern 234, a second dummy gate electrode 244 and the second dummy gate mask 254 sequentially stacked on the second active fin 204 of the substrate 200 and a portion of the isolation pattern 220 adjacent to the second active fin 204 in the second direction.

The dummy gate insulation layer may be formed of an oxide, e.g., silicon oxide, the dummy gate electrode layer may be formed of, e.g., polysilicon, and the dummy gate mask layer may be formed of a nitride, e.g., silicon nitride. The dummy gate insulation layer may be formed by a CVD process, an ALD process, or the like. Alternatively, the dummy gate insulation layer may be formed by a thermal oxidation process on an upper portion of the substrate 200, and in this case, the dummy gate insulation layer may not be formed on the isolation pattern 220 but may be formed only on the first and second active fins 202 and 204. The dummy gate electrode layer and the dummy gate mask layer may be also formed by a CVD process, an ALD process, etc.

In example embodiments, each of the first and second dummy gate structures may be formed to extend in the second direction on each of the first and second active fins 202 and 204, respectively, of the substrate 200 and the isolation pattern 220, and a plurality of first dummy gate structures and a plurality of second dummy gate structures may be formed in the first direction.

An ion implantation process may be further performed to form an impurity region (not shown) at an upper portion of each of the first and second active fins 202 and 204 adjacent the first and second dummy gate structures, respectively.

Figure 14:
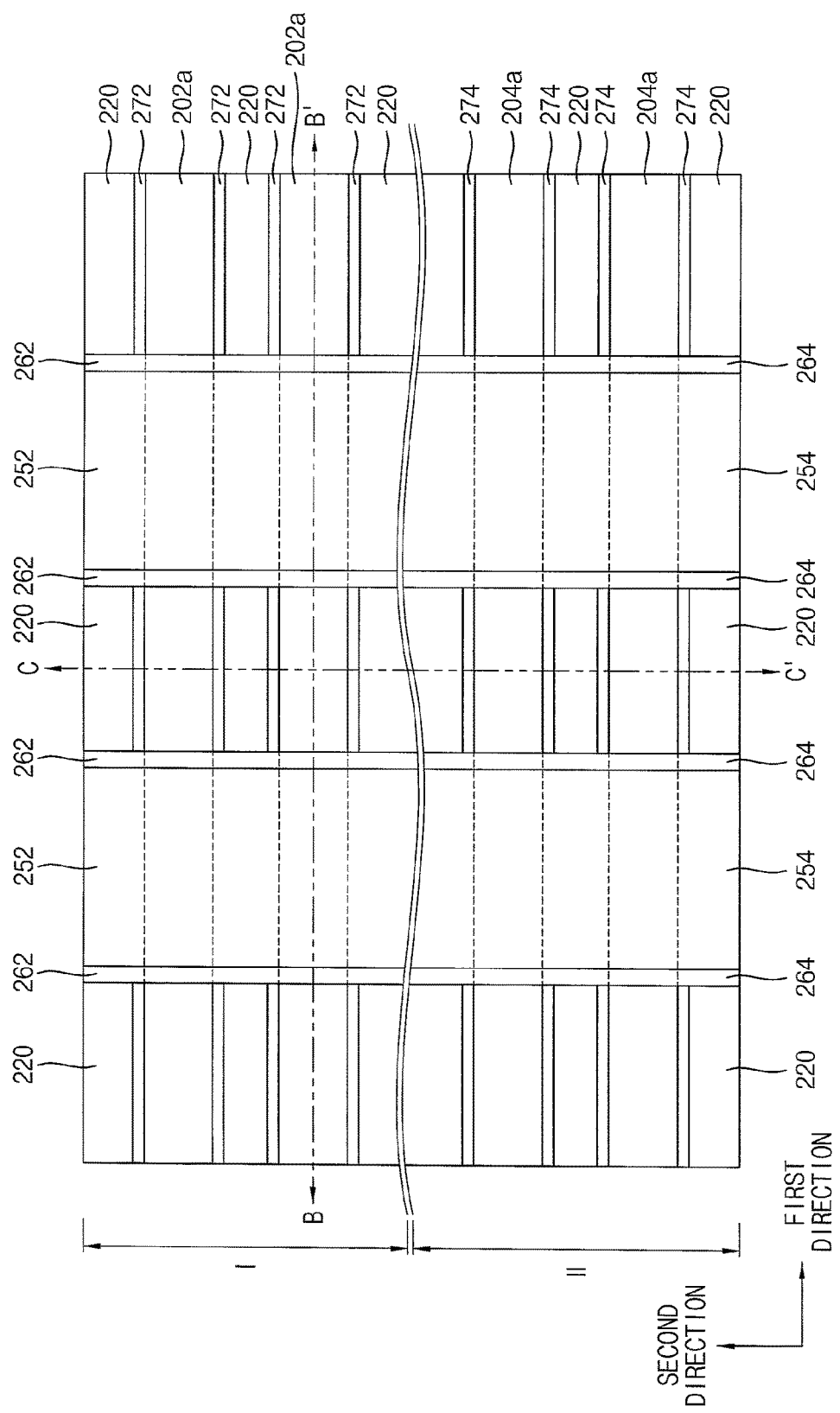
Figure 15:
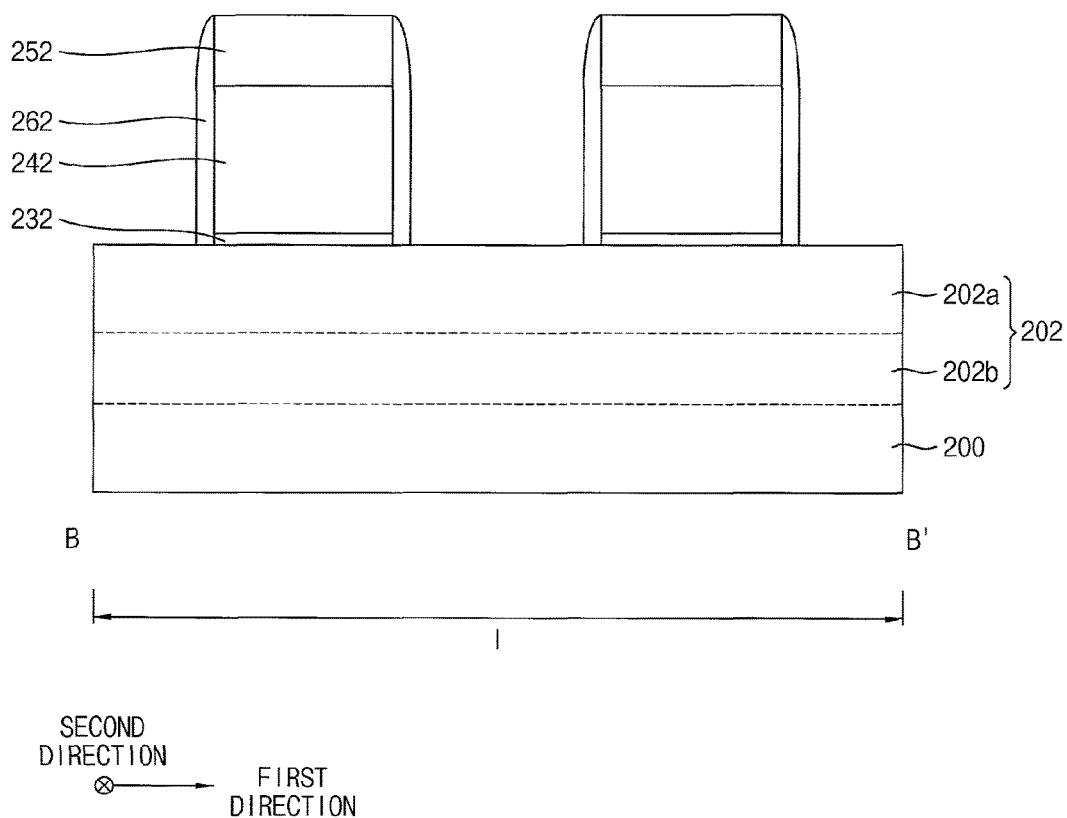
Figure 16:
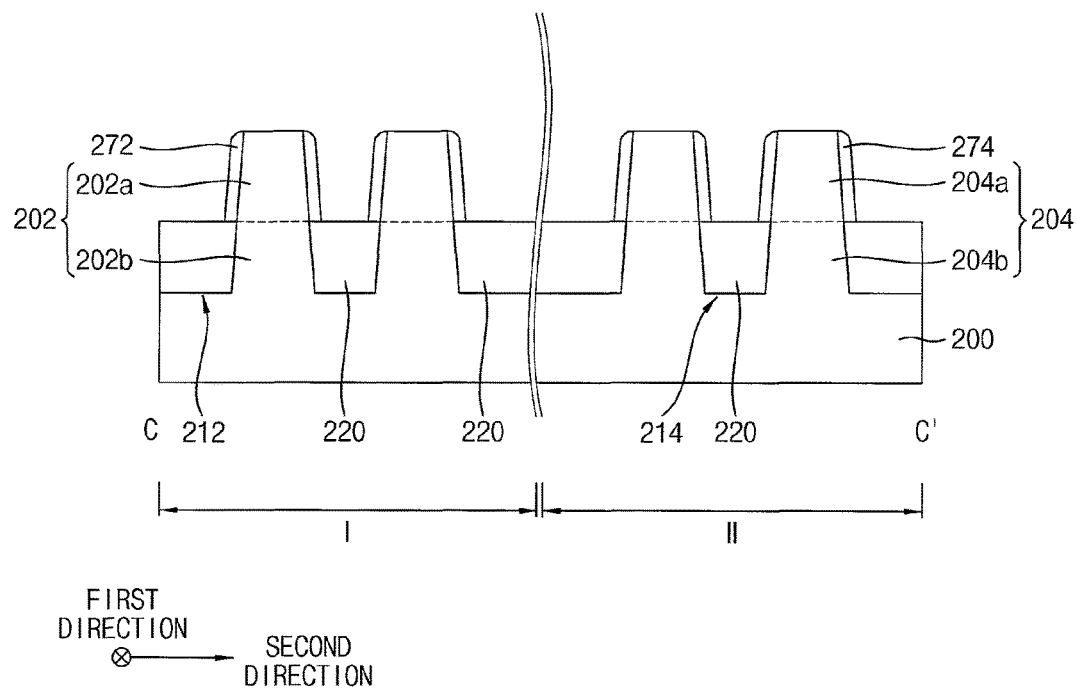

Referring to FIGS. 14 to 16, first and second gate spacers 262 and 264 may be formed on sidewalls of the first and second dummy gate structures, respectively. Additionally, first and second fin spacers 272 and 274 may be formed on sidewalls of the first and second active fins 202 and 204, respectively.

In example embodiments, the first and second gate spacers 262 and 264 and the first and second fin spacers 272 and 274 may be formed by forming a spacer layer on the first and second dummy gate structures, the first and second active fins 202 and 204 and the isolation pattern 220, and anisotropically etching the spacer layer. The spacer layer may be formed of a nitride, e.g., silicon nitride, silicon carbonitride, etc.

Each of the first and second gate spacers 262 and 264 may be formed on the sidewalls of each of the first and second dummy gate structures opposite to each other in the first direction, and each of the first and second fin spacers 272 and 274 may be formed on the sidewalls of each of the first and second active fins 202 and 204 opposite to each other in the second direction.

Figure 17:
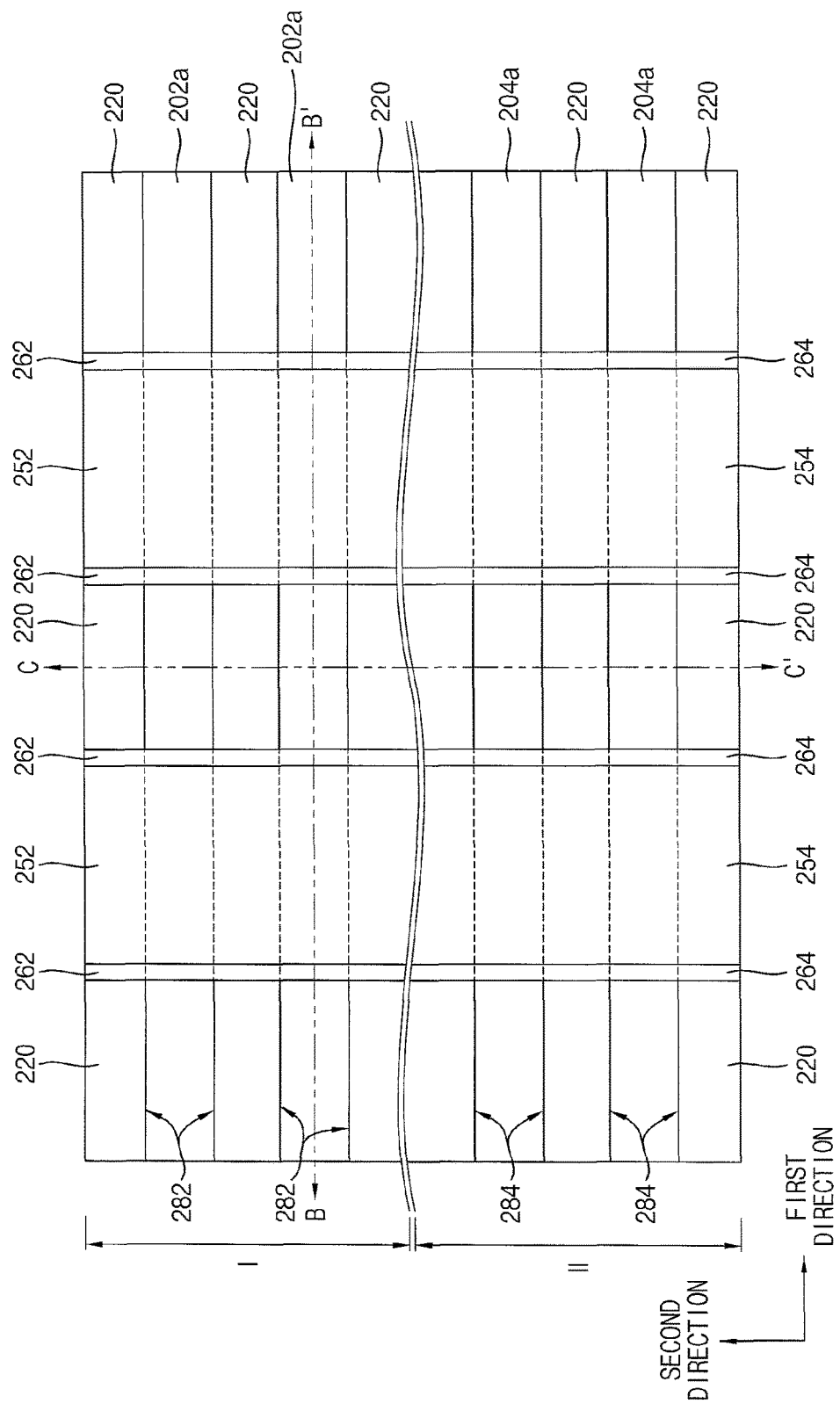
Figure 18:
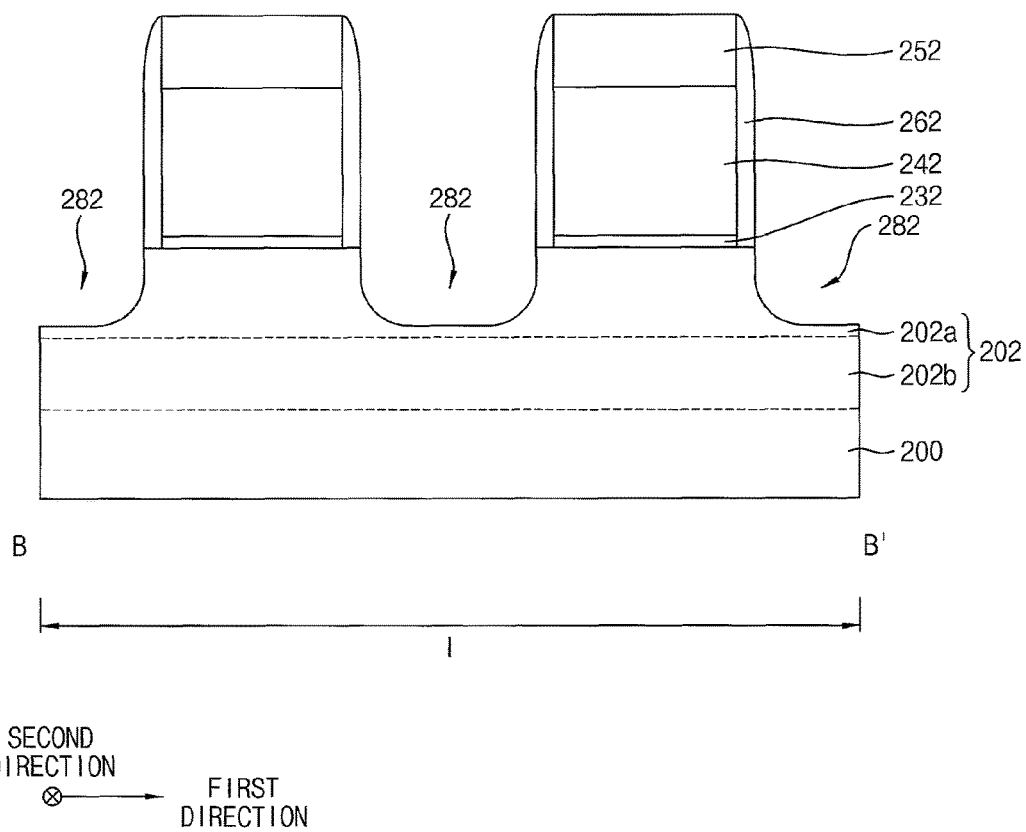
Figure 19:
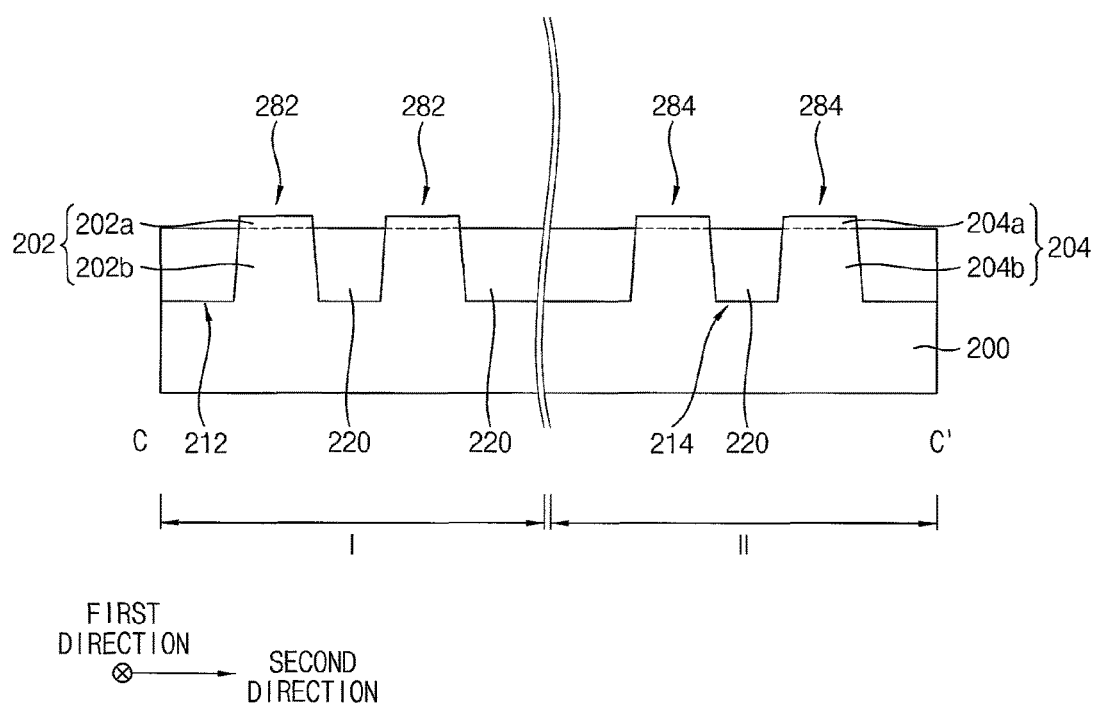

Referring to FIGS. 17 to 19, upper portions of the first and second active fins 202 and 204 adjacent the first and second dummy gate structures, respectively, may be etched to form third and fourth recesses 282 and 284, respectively.

Particularly, the upper portions of the first and second active fins 202 and 204 may be etched using the first and second dummy gate structures and the first and second gate spacers 262 and 264 as an etching mask to form the third and fourth recesses 282 and 284. In the etching process, the first and second fin spacers 272 and 274 may be also removed. FIGS. 17 to 19 show that the first and second upper active patterns 202a and 204a in the first and second active fins 202 and 204, respectively, are partially etched to form the third and fourth recesses 282 and 284, respectively, however, the inventive concepts may not be limited thereto. For example, each of the third and fourth recesses 282 and 284 may be formed by partially removing each of the first and second upper active patterns 202a and 204a to expose each of the first and second lower active patterns 202b and 204b, and further, a portion of each of the first and second lower active patterns 202b and 204b may be removed when each of the third and fourth recesses 282 and 284 is formed.

Figure 20:
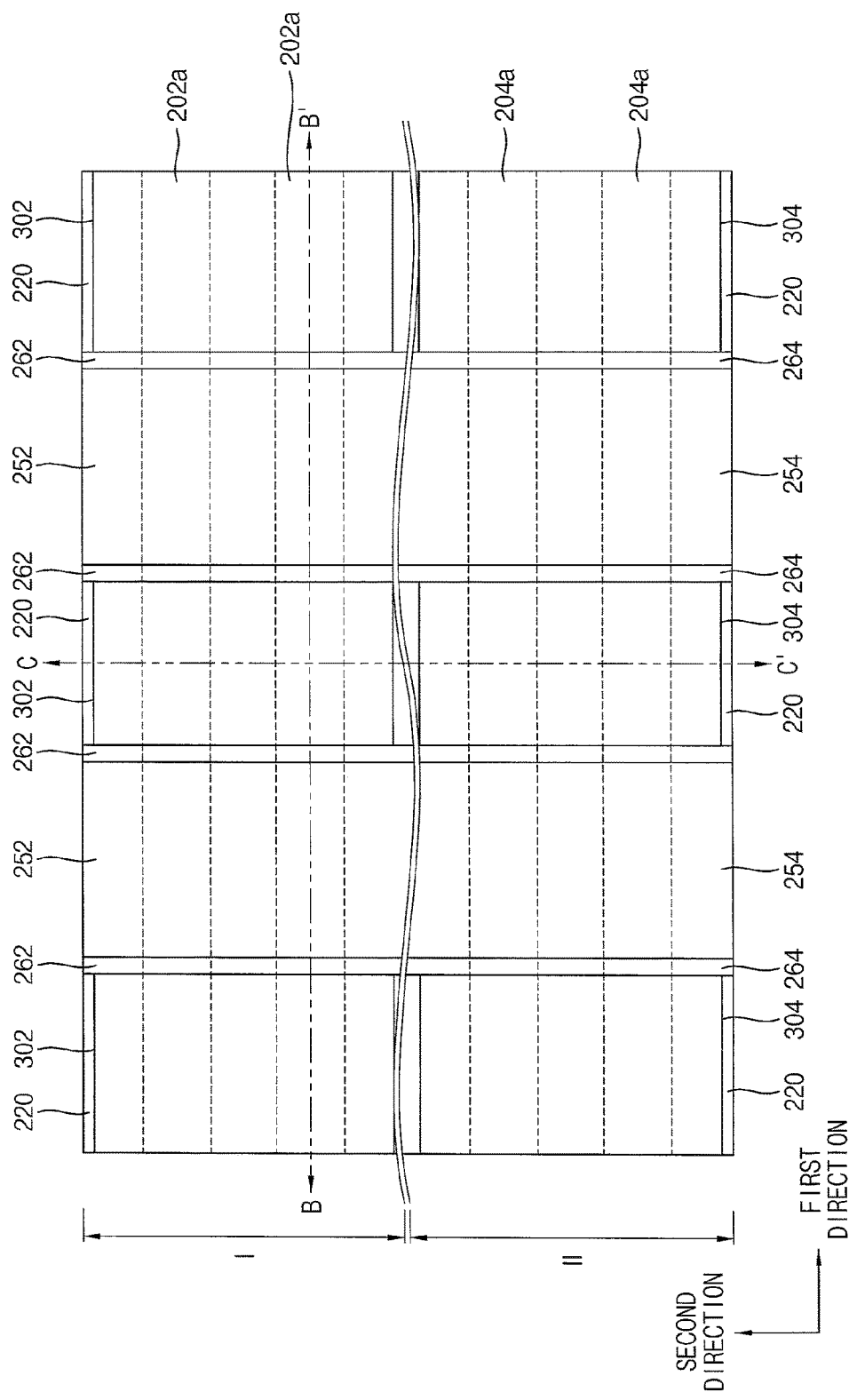
Figure 21:
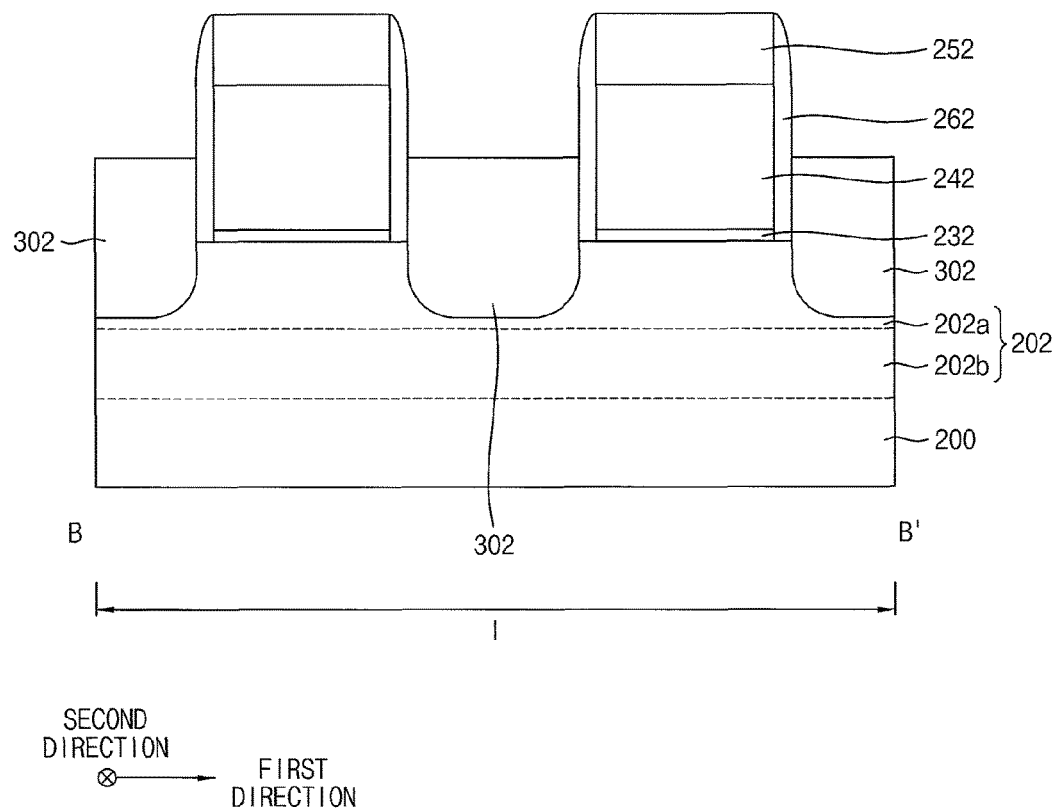
Figure 23:
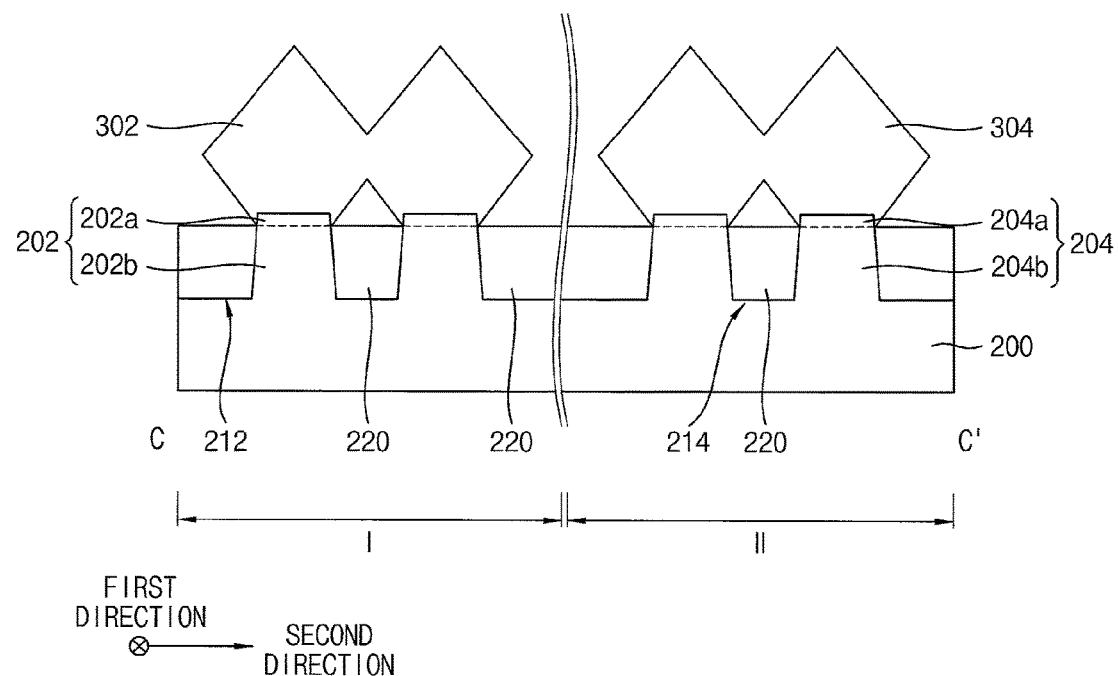

Referring to FIGS. 20, 21 and 23, first and second source/drain layers 302 and 304 may be formed on the first and second active fins 202 and 204, respectively, to fill the third and fourth recesses 282 and 284, respectively.

In example embodiments, the first and second source/drain layers 302 and 304 may be formed by a selective epitaxial growth (SEG) process using top surfaces of the first and second active fins 202 and 204 exposed by the third and fourth recesses 282 and 284, respectively, as a seed.

In example embodiments, the first source/drain layer 302 may be formed by a SEG process using a silicon source gas, e.g., dichlorosilane ($SiH_2Cl_2$) gas, and a germanium source gas, e.g., germane ($GeH_4$) gas to form a single crystalline silicon-germanium layer. A p-type impurity source gas, e.g., diborane ($B_2H_6$) gas may be also used to form a single crystalline silicon-germanium layer doped with p-type impurities. Accordingly, the first source/drain layer 302 may serve as a source/drain region of a PMOS transistor (e.g., PMOS fin field-effect transistor, PMOS FinFET).

In example embodiments, the second source/drain layer 304 may be formed by a SEG process using a silicon source gas, e.g., disilane ($Si_2H_6$) gas and a carbon source gas, e.g., monomethylsilane ($SiH_3CH_3$) gas to form a single crystalline silicon carbide layer. Alternatively, the second source/drain layer 304 may be formed by a SEG process using only a silicon source gas, e.g., disilane ($Si_2H_6$) gas to form a single crystalline silicon layer. An n-type impurity source gas, e.g., phosphine ($PH_3$) gas may be also used to form a single crystalline silicon carbide layer doped with n-type impurities or a single crystalline silicon layer doped with n-type impurities. Accordingly, the second source/drain layer 304 may serve as a source/drain region of an NMOS transistor (e.g., NMOS fin field-effect transistor, NMOS FinFET).

Each of the first and second source/drain layers 302 and 304 may grow both in vertical and horizontal directions, and thus may not only fill each of the third and fourth recesses 282 and 284 but also contact a portion of each of the first and second gate spacers 262 and 264. An upper portion of each of the first and second source/drain layers 302 and 304 may have a cross-section taken along the second direction of which a shape may be pentagon or hexagon. When the first active fins 202 or the second active fins 204 are spaced apart from each other in the second direction by a short distance, neighboring ones of the first source/drain layers 302 in the second direction or neighboring ones of the second source/drain layers 304 in the second direction may be merged with each other to form a single layer. FIGS. 20, 21 and 23 show that one first source/drain layer 302 merged from a plurality of first source/drain layers 302 that have grown on neighboring ones of the first active fins 202, and one second source/drain layer 304 merged from a plurality of second source/drain layers 304 that have grown on neighboring ones of the second active fins 204 are shown.

Figure 22:
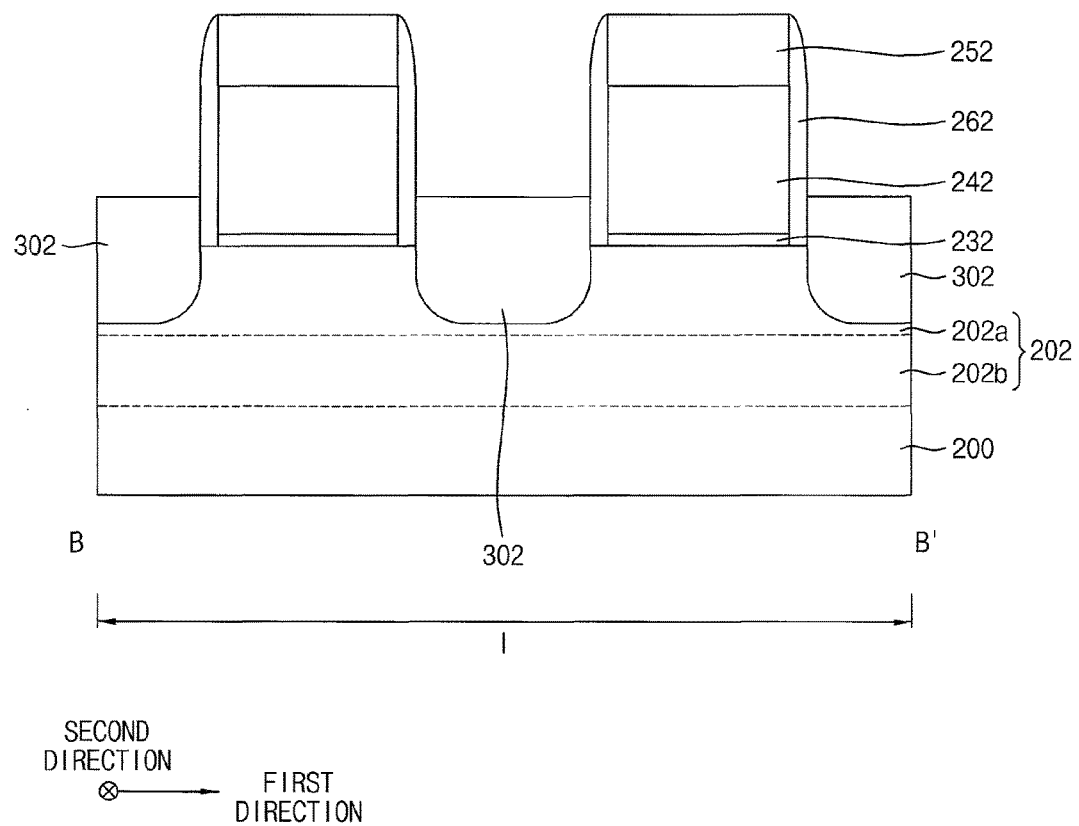
Figure 24:
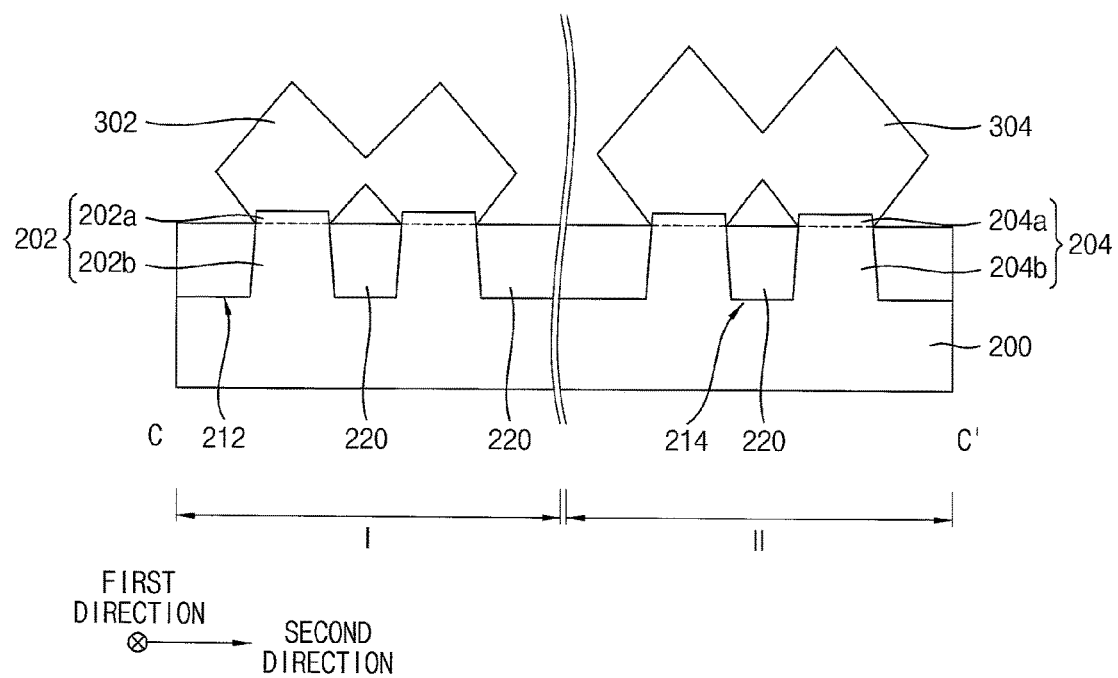

Referring to FIGS. 22 and 24, upper surfaces of the first and second source/drain layers 302 and 304 may have heights different from each other.

In example embodiments, the first source/drain layer 302 in the first region I may have an upper surface lower than that of an upper surface of the second source/drain layer 304 in the second region II.

Figure 25:
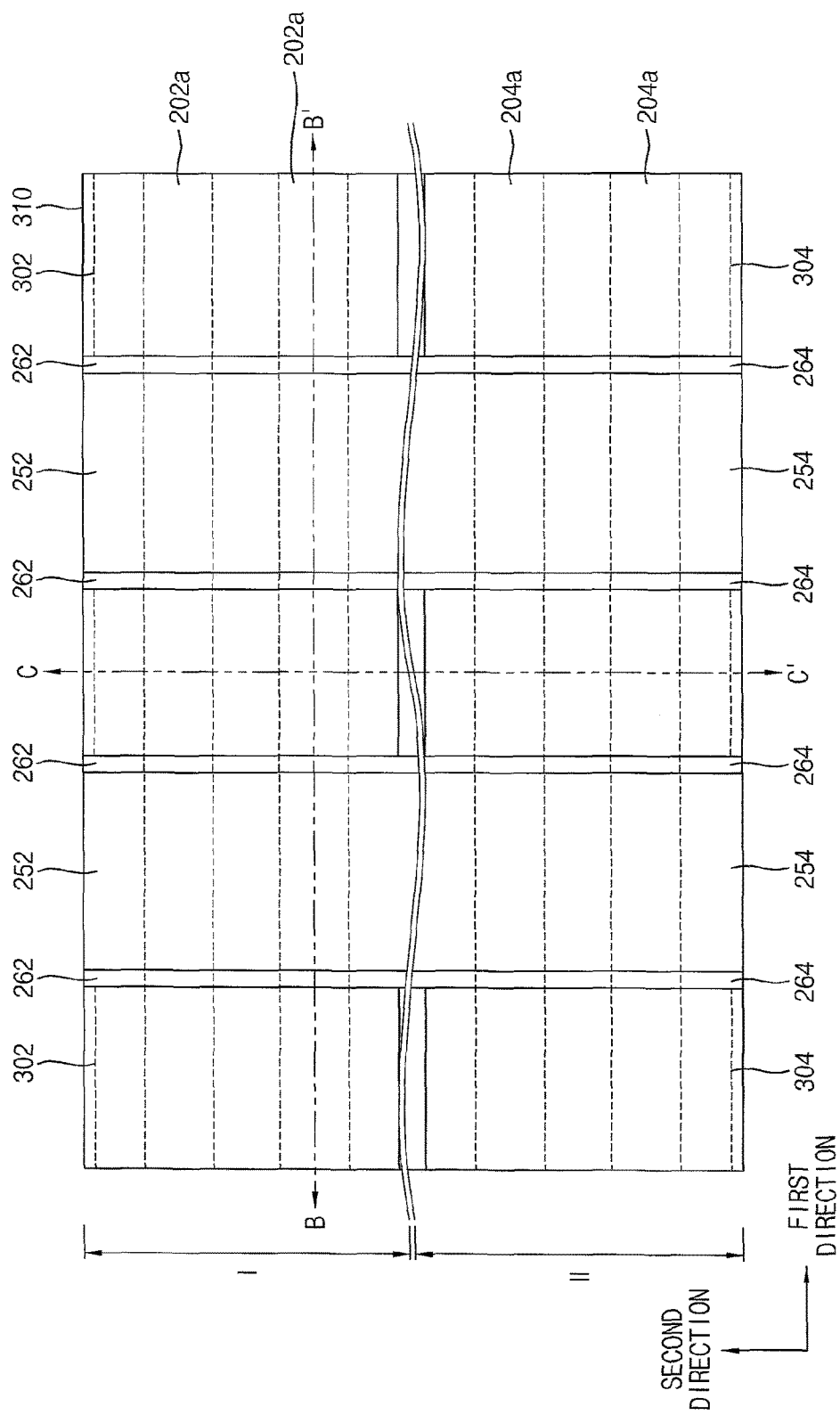
Figure 26:
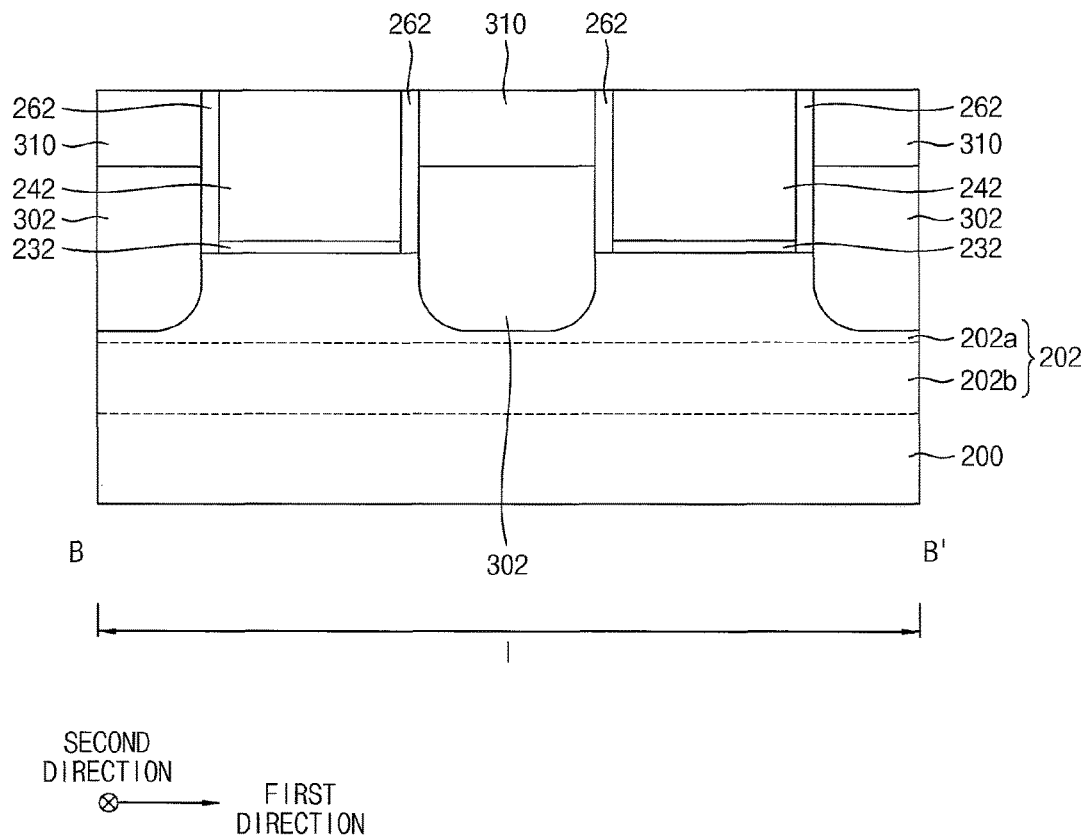
Figure 27:
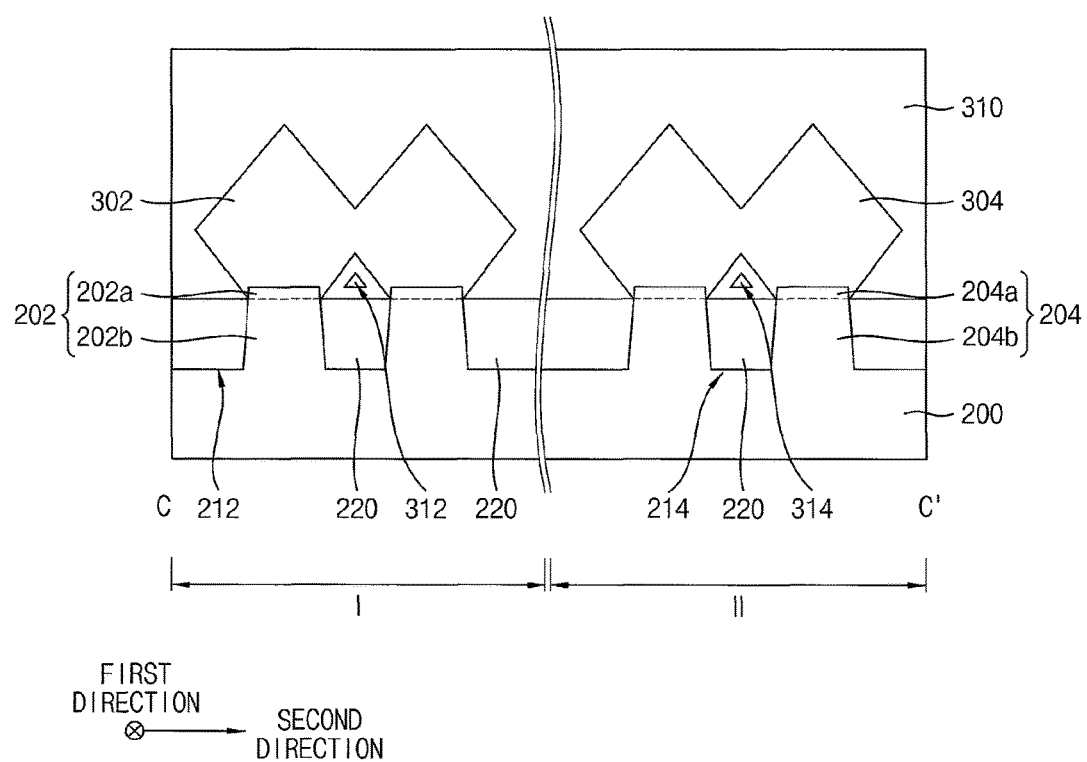

Referring to FIGS. 25 to 27, an insulation layer 310 may be formed on the first and second active fins 202 and 204 and the isolation pattern 220 to cover the first and second dummy gate structures, the first and second gate spacers 262 and 264 and the first and second source/drain layers 302 and 304, and the insulation layer 310 may be planarized until upper surfaces of the first and second dummy gate electrodes 242 and 244 of the first and second dummy gate structures, respectively, may be exposed. The first and second dummy gate masks 252 and 254 may be also removed, and upper portions of the first and second gate spacers 262 and 264 may be also removed. The insulation layer 310 may not completely fill a first space between the merged first source/drain layer 302 and the isolation pattern 220 or a second space between the merged second source/drain layer 304 and the isolation pattern 220, and thus first and second air gaps 312 and 314 may be formed in the first and second spaces, respectively.

The insulation layer 310 may be formed of silicon oxide, e.g., tonen silazene (TOSZ). The planarization process may be performed by a CMP process and/or an etch back process.

Figure 28:
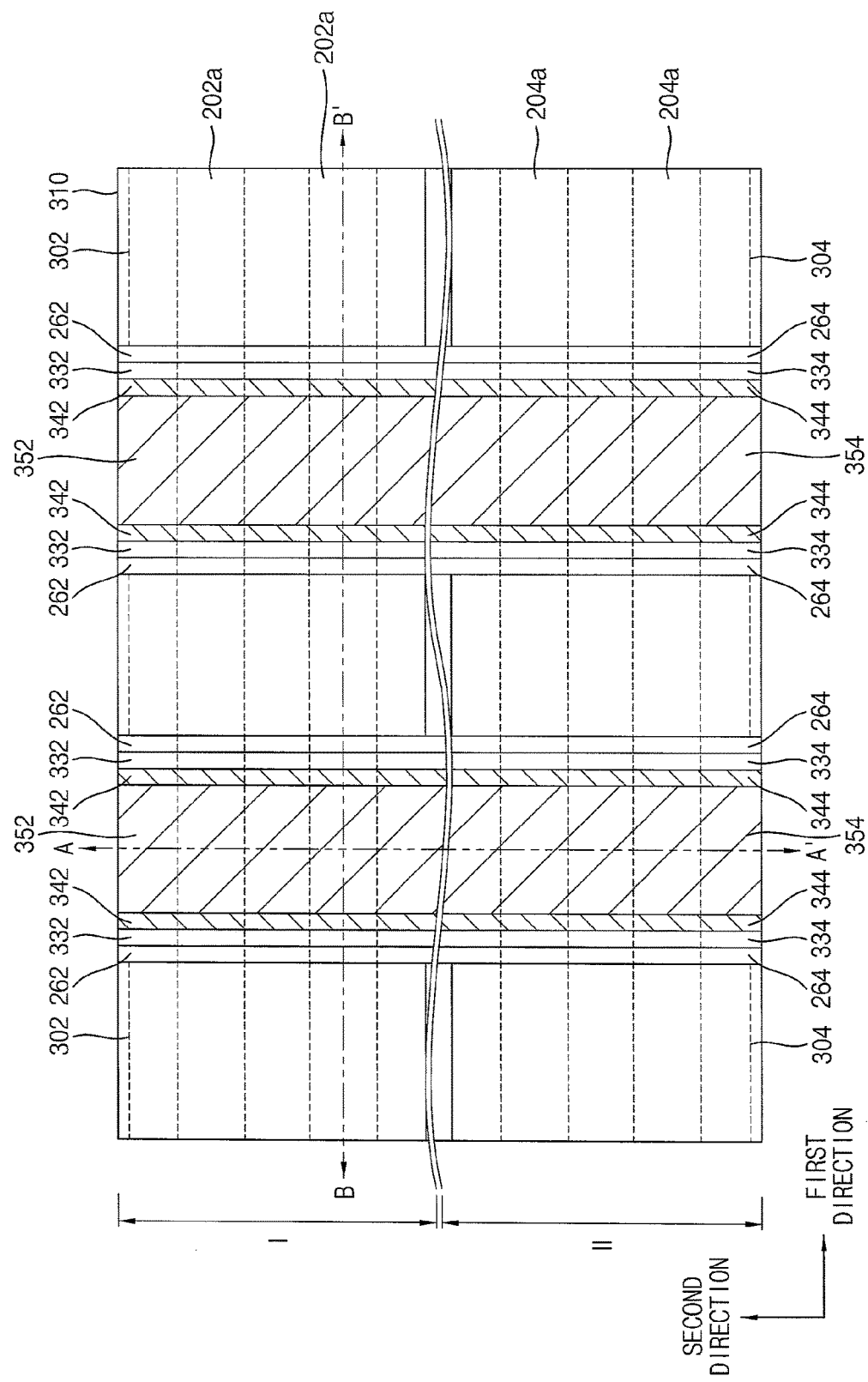
Figure 29:
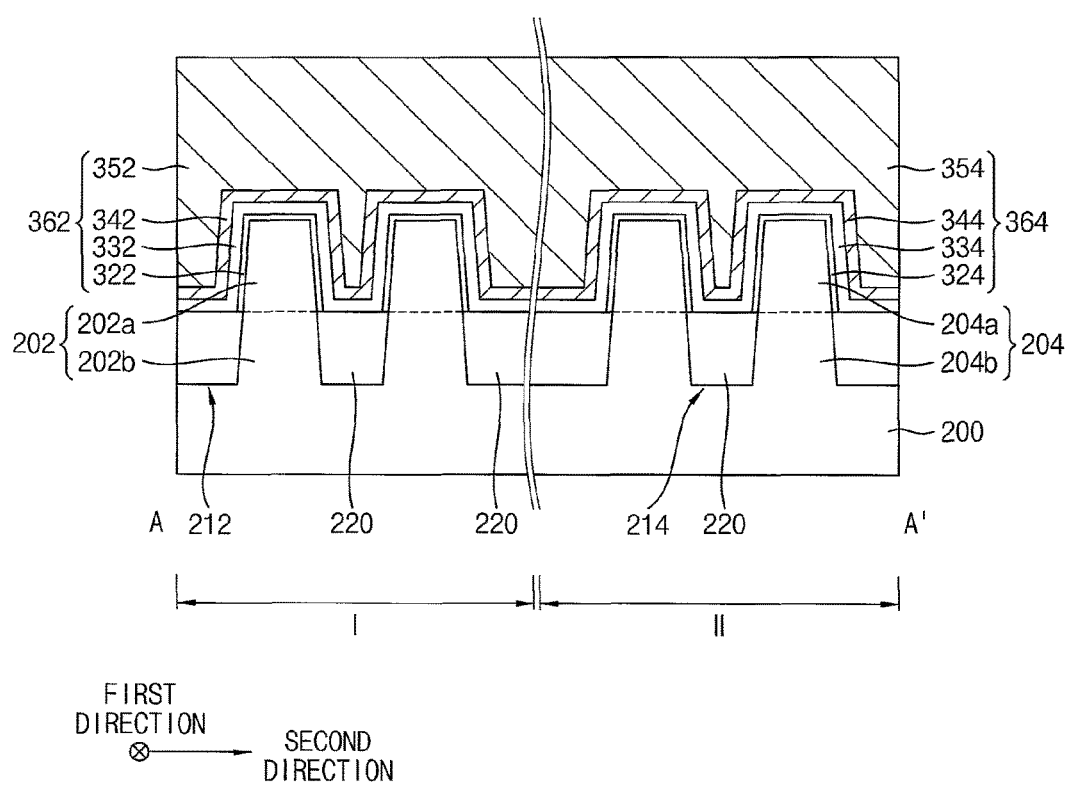
Figure 30:
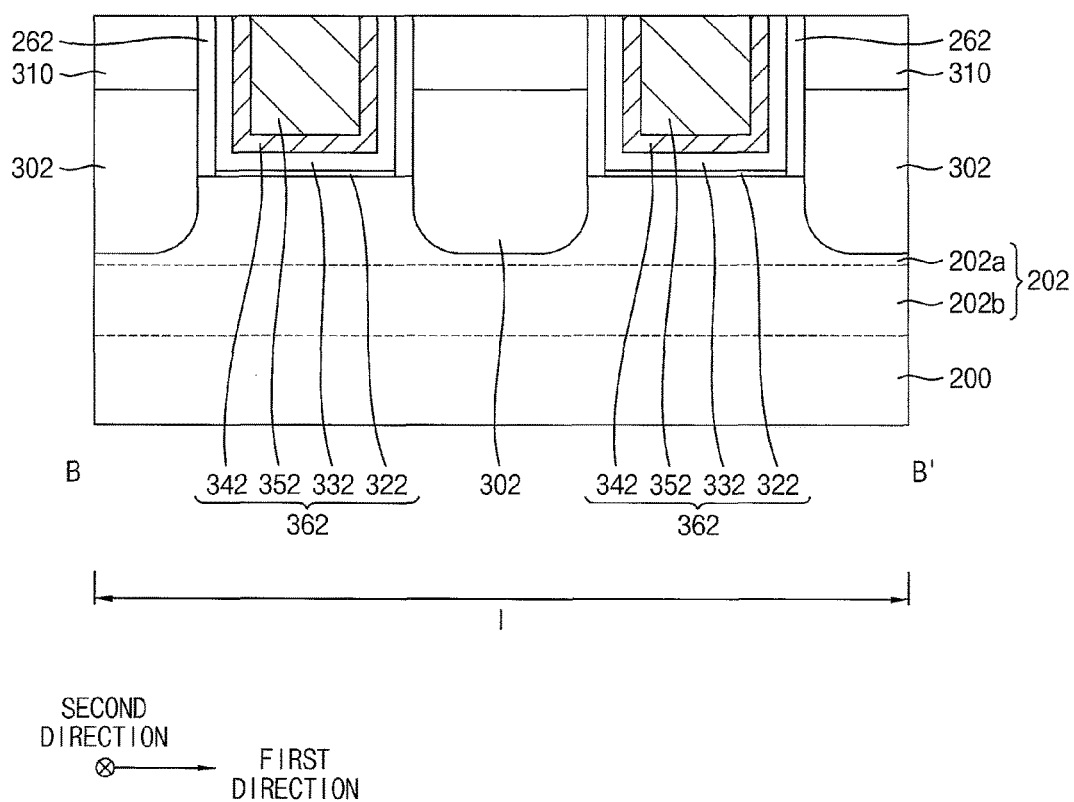

Referring to FIGS. 28 to 30, the exposed first and second dummy gate electrodes 242 and 244, and the first and second dummy gate insulation patterns 232 and 234 thereunder may be removed to form first and second openings (not shown) exposing upper surfaces of the first and second active fins 202 and 204, respectively, and inner sidewalls of the first and second gate spacers 262 and 264, respectively. First and second gate structures 362 and 364 may be formed to fill the first and second openings, respectively.

Particularly, after a thermal oxidation process is performed on the exposed upper surfaces of the first and second active fins 202 and 204, respectively, to form first and second interface patterns 322 and 324, respectively, a gate insulation layer and a work function control layer may be sequentially formed on the first and second interface patterns 322 and 324, the isolation pattern 220, the first and second gate spacers 262 and 264 and the insulation layer 310, and a gate electrode layer may be formed on the work function control layer to fill remaining portions of the first and second openings, respectively.

The gate insulation layer may be formed of a metal oxide having a high dielectric constant, e.g., hafnium oxide, tantalum oxide, zirconium oxide, or the like, by a CVD process, a PVD process, an ALD process, or the like. The work function control layer may be formed of a metal nitride or a metal alloy, e.g., titanium nitride, titanium aluminum, titanium aluminum nitride, tantalum nitride, tantalum aluminum nitride, etc., and the gate electrode layer may be formed of a material having a low resistance, e.g., a metal such as aluminum, copper, tantalum, etc., or a metal nitride thereof. The work function control layer and the gate electrode layer may be formed by a CVD process, a PVD process, an ALD process, or the like. In an example embodiment, a heat treatment process, e.g., a rapid thermal annealing (RTA) process, a spike rapid thermal annealing (spike RTA) process, a flash rapid thermal annealing (flash RTA) process or a laser annealing process may be further performed on the gate electrode layer.

The first and second interface patterns 322 and 324 may be formed by a CVD process, a PVD process, an ALD process instead of the thermal oxidation process, and in this case, the first and second interface patterns 322 and 324 may be formed not only on the upper surfaces of the first and second active fins 202 and 204, respectively, but also on the upper surface of the isolation layer pattern 220 and the inner sidewalls of the first and second gate spacers 262 and 264, respectively.

The gate electrode layer, the work function control layer and the gate insulation layer may be planarized until the upper surface of the insulation layer 310 may be exposed to form a first gate insulation pattern 332 and a first work function control pattern 342 sequentially stacked on upper surfaces of the first interface pattern 332 and the isolation pattern 220 and the inner sidewall of the first gate spacer 262, and a first gate electrode 352 filling a remaining portion of the first opening on the first work function control pattern 342. Additionally, a second gate insulation pattern 334 and a second work function control pattern 344 sequentially stacked on upper surfaces of the second interface pattern 334 and the isolation pattern 220 and the inner sidewall of the second gate spacer 264, and a second gate electrode 354 filling a remaining portion of the second opening on the second work function control pattern 344 may be formed.

Thus, a bottom and a sidewall of each of the first and second gate electrodes 352 and 354 may be covered by each of the first and second work function control patterns 342 and 344. In example embodiments, the planarization process may be performed by a CMP process and/or an etch back process.

The first interface pattern 322, the first gate insulation pattern 332, the first work function control pattern 342 and the first gate electrode 352 sequentially stacked may form the first gate structure 362, and the first gate structure 362 and the first source/drain layer 302 may form a PMOS transistor. Additionally, the second interface pattern 324, the second gate insulation pattern 334, the second work function control pattern 344 and the second gate electrode 354 sequentially stacked may form the second gate structure 364, and the second gate structure 364 and the second source/drain layer 304 may form an NMOS transistor.

Figure 31:
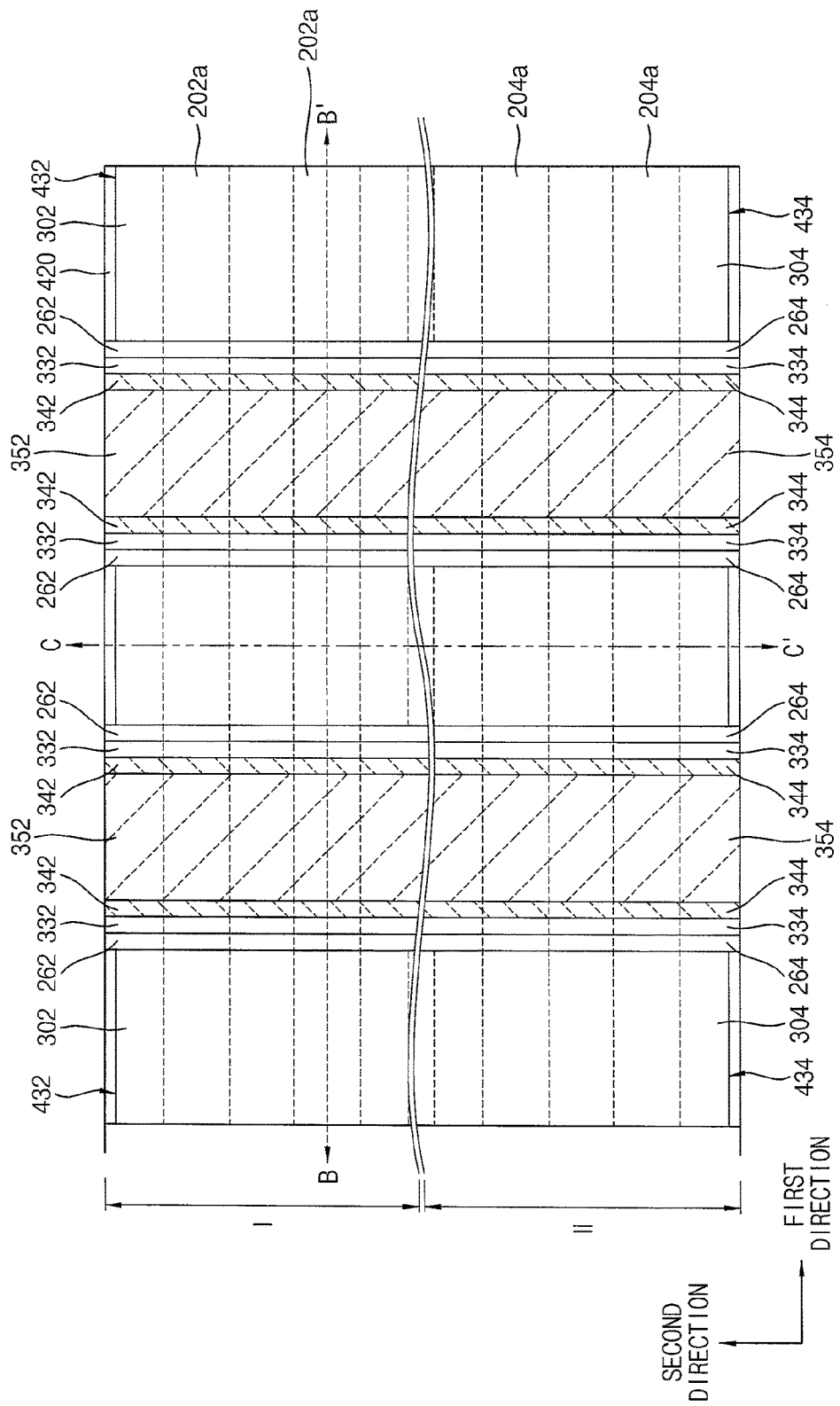
Figure 32:
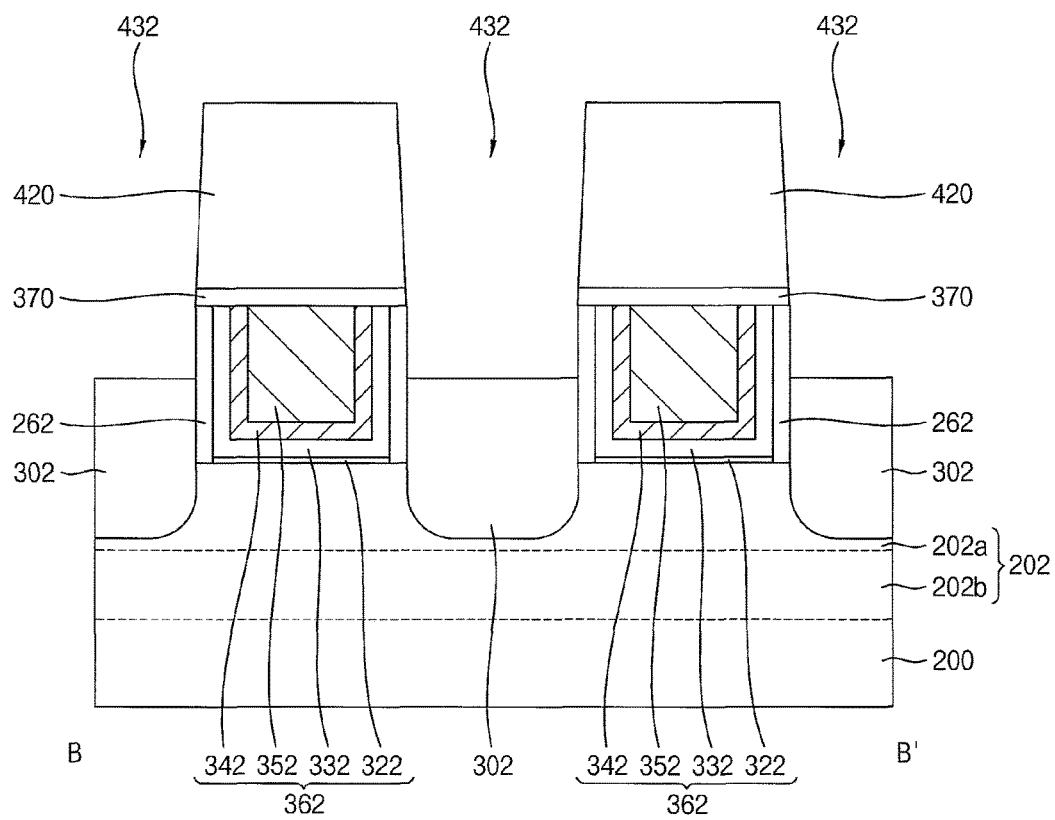
Figure 33:
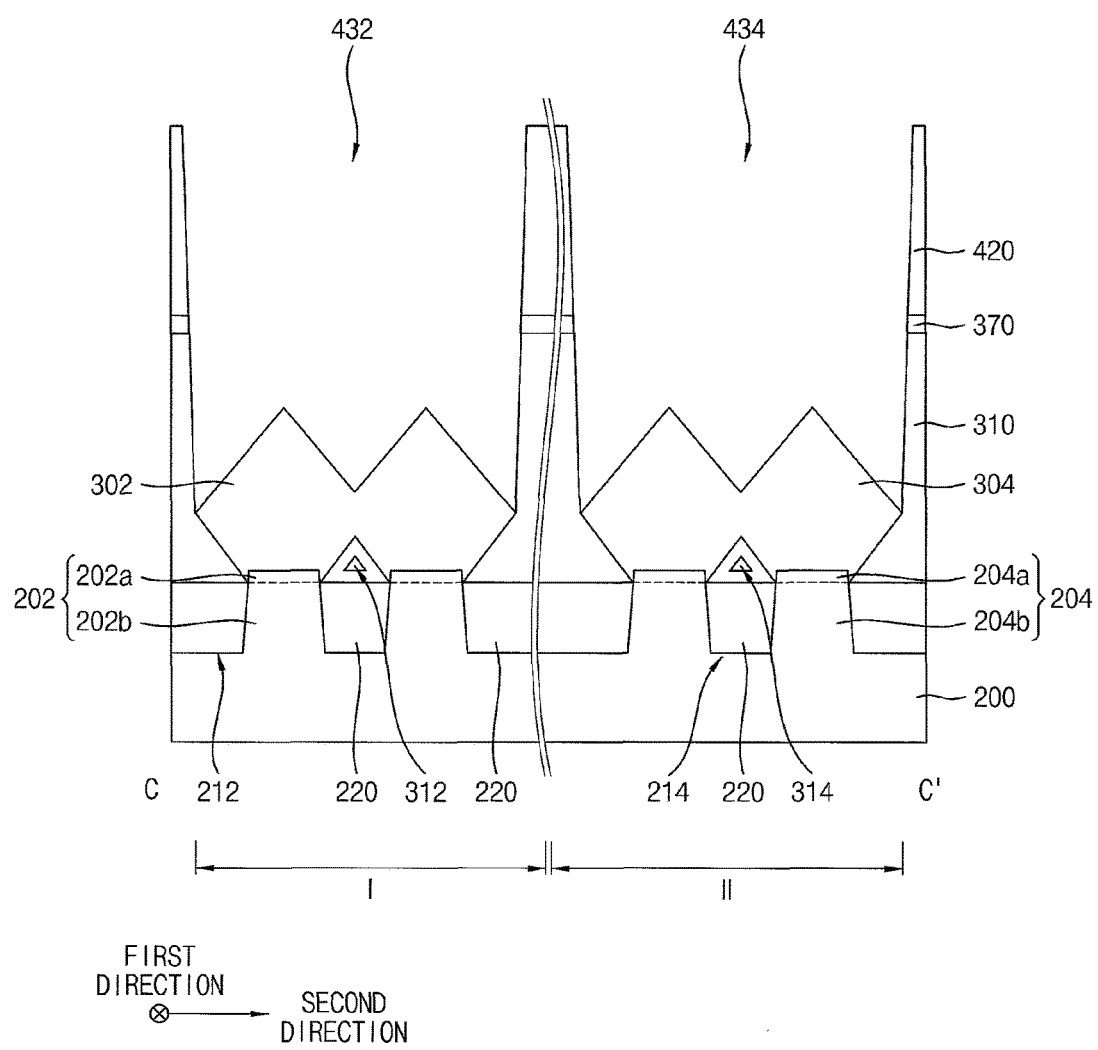

Referring to FIGS. 31 to 33, a capping layer 370 and a first insulating interlayer 420 may be sequentially formed on the insulation layer 310, the first and second gate structures 362, 364, and the first and second gate spacers 262 and 264, and first and second contact holes 432 and 434 may be formed through the insulation layer 310, the capping layer 370 and the first insulating interlayer 420 to expose upper surfaces of the first and second source/drain layers 302 and 304, respectively.

The first insulating interlayer 420 may be formed of silicon oxide, e.g., tetra ethyl ortho silicate (TEOS).

Figure 34:
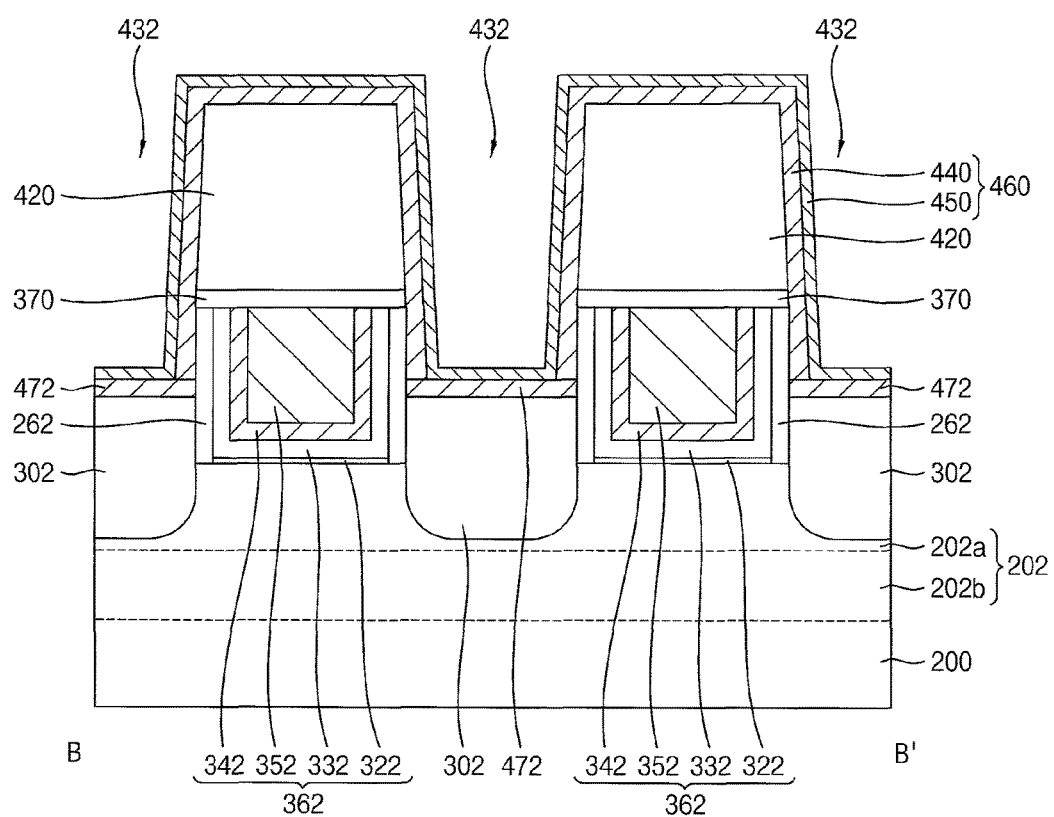
Figure 35:
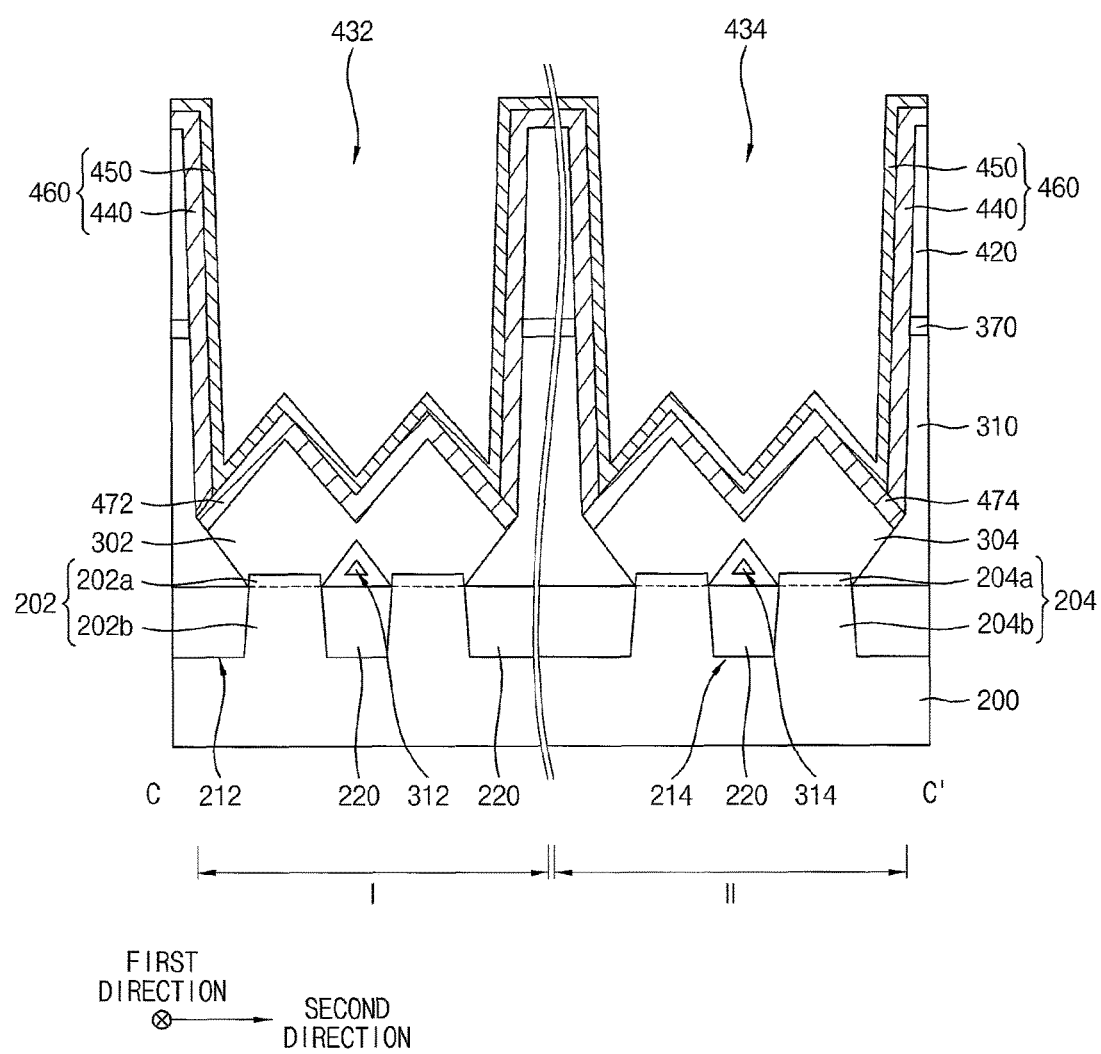

Referring to FIGS. 34 and 35, processes substantially the same as or similar to those illustrated with reference to FIGS. 2 to 5 may be performed.

In example embodiment, a first metal layer 440 and a first metal nitride layer 450 may be sequentially formed on the exposed upper surfaces of the first and second source/drain layers 302 and 304, sidewalls of the first and second contact holes 432 and 434 and an upper surface of the first insulating interlayer 420, and a heat treatment process may be performed to form first and second metal silicide patterns 472 and 474 on the first and second source/drain layers 302 and 304, respectively.

The first metal layer 440 may be formed of a metal, e.g., titanium, cobalt, nickel, etc., and the first metal nitride layer 450 may be formed of a metal nitride, e.g., titanium nitride, tantalum nitride, tungsten nitride, etc.

In example embodiments, the first metal nitride layer 450 may be formed to have a thickness of equal to or less than about 3 nm.

In example embodiment, a nitridation process may be performed on the first metal nitride layer 450 to enhance the barrier characteristics and reduce the resistance of the first metal nitride layer 450.

In example embodiments, the nitridation process may be performed to further nitridate a first portion of the first metal layer 440 and a second portion of each of the first and second metal silicide patterns 472 and 474. For example, the first portion of the first metal layer 440 may include a top portion of the first metal layer 440 disposed on the insulating interlayer 420, and an inner portion of the first metal layer 440 in the first and second contact holes 432 and 434, respectively. The second portion of each of the first and second metal silicide patterns 472 and 474 may include a top portion of each of the first and second metal silicide patterns 472 and 474 in the first and second contact holes 432 and 434, respectively.

In example embodiments, the element (e.g., titanium) in the first and second metal silicide patterns 472 and 474 which are not reacted with the source/drain layer 302 may be nitridated after the nitridation process.

In example embodiments, a nitrogen concentration of the first metal layer 440 may gradually decrease with respect to a distance from an interface between the first metal layer 440 and the metal nitride layer 450 after the nitridation process. Also, a nitrogen concentration of each of the first and second metal silicide patterns 472 and 474 may gradually decrease with respect to a distance from an interface between each of the metal silicide patterns 472 and 474 and the metal nitride layer 450, respectively, after the nitridation process.

Figure 36:
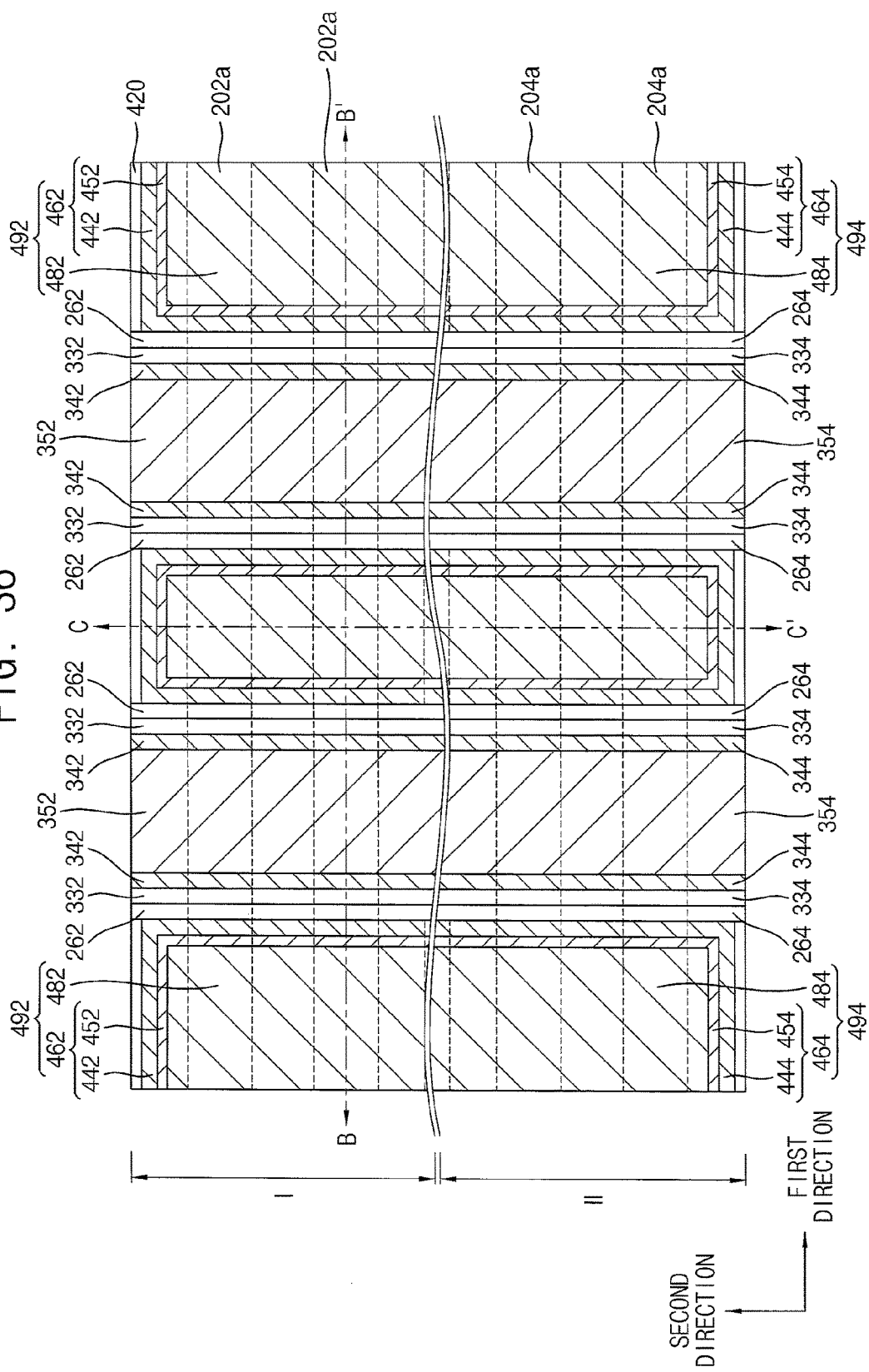
Figure 37:
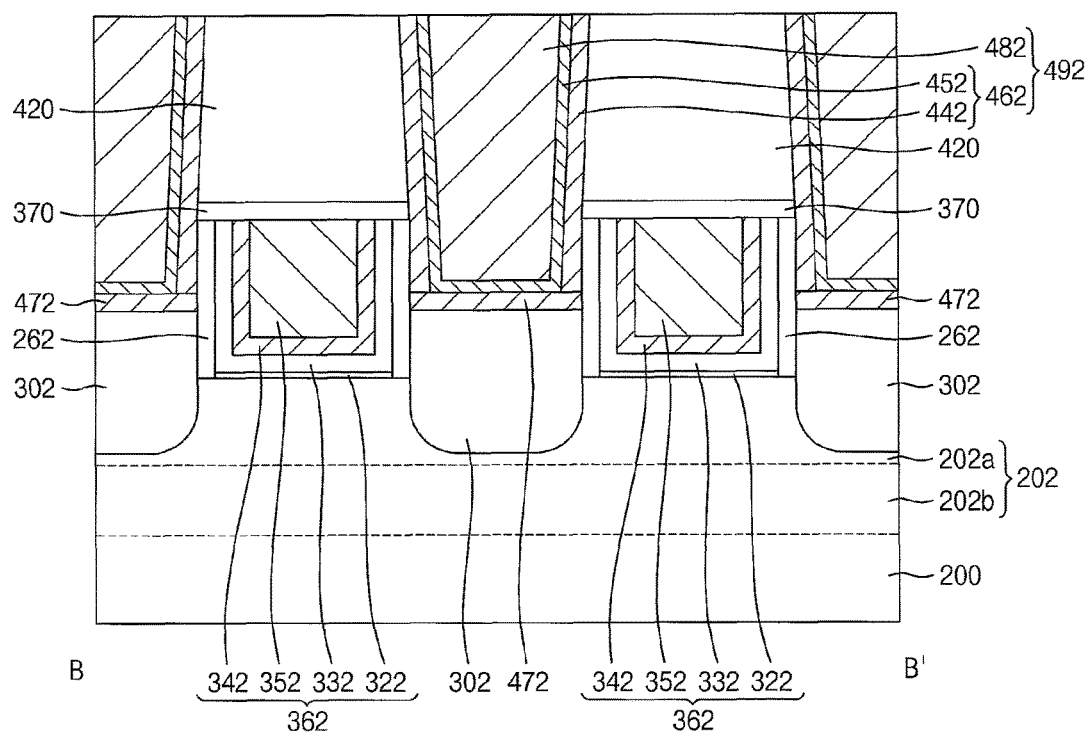
Figure 38A:
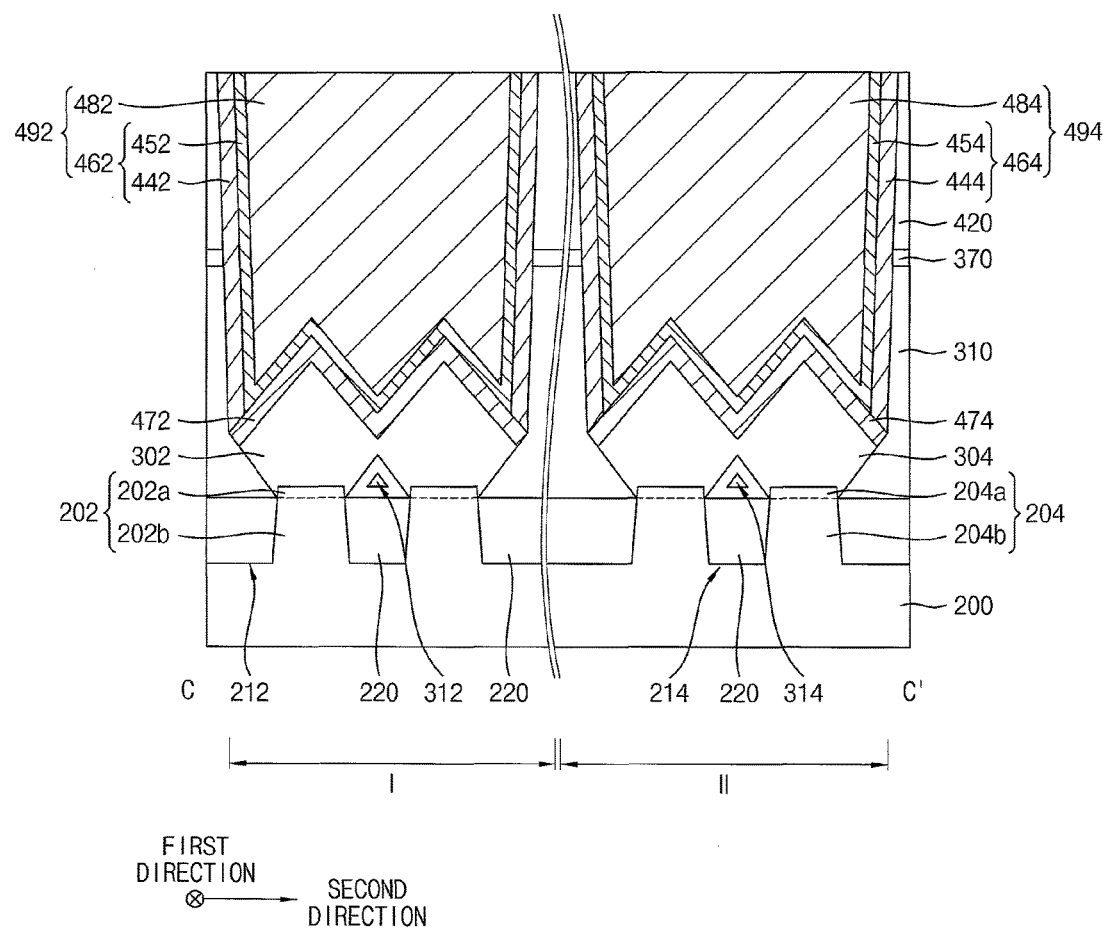

Referring to FIGS. 36, 37 and 38A, processes substantially the same as or similar to those illustrated with reference to FIGS. 6 and 7A or 7B may be performed.

A second metal layer 480 may be formed on the first metal nitride layer 450 to fill the first and second contact holes 432 and 434, and the second metal layer 480, the first metal nitride layer 450 and the first metal layer 440 may be planarized until an upper surface of the first insulating interlayer 420 may be exposed.

As a result, first and second contact plugs 492 and 494 may be formed on the first and second metal silicide patterns 472 and 474, respectively, to fill the first and second contact holes 432 and 434, respectively.

In example embodiments, the first and second contact plugs 492 and 494 may be formed to be self-aligned with the first and second gate spacers 262 and 264, respectively, however, the present disclosure is not limited thereto.

The second metal layer 480 may be formed of, e.g., tungsten.

The first contact plug 492 may include a first barrier pattern 462 and a second metal pattern 482, and the first barrier pattern 462 may include a first metal pattern 442 and a first metal nitride pattern 452. The second contact plug 494 may include a second barrier pattern 464 and a fourth metal pattern 484, and the second barrier pattern 464 may include a third metal pattern 444 and a second metal nitride pattern 454.

The first metal nitride pattern 452 may contact an upper surface of the first metal silicide pattern 472, and may cover a bottom and a sidewall of the second metal pattern 482. The first metal pattern 442 may contact an upper surface of the first metal silicide pattern 472, and may cover an outer sidewall of the first metal nitride pattern 452. The second metal nitride pattern 454 may contact an upper surface of the second metal silicide pattern 474, and may cover a bottom and a sidewall of the fourth metal pattern 484. The third metal pattern 444 may contact an upper surface of the second metal silicide pattern 474, and may cover an outer sidewall of the second metal nitride pattern 454.

Each of the first and second metal nitride patterns 452 and 454 of each of the first and second contact plugs 492 and 494 may have a thin thickness of equal to or less than about 3 nm, and thus each of the second and fourth metal patterns 482 and 484 having a resistance lower than that of each of the first and second metal nitride patterns 452 and 454 may have a relatively large volume. Each of the first and second metal nitride patterns 452 and 454 may have an increased nitrogen concentration due to a nitridation process, and thus may have a resistance lower than that of a metal nitride pattern on which no nitridation process is performed. Accordingly, the first contact plug 492 including the first metal nitride pattern 452 and the second metal pattern 482, and the second contact plug 494 including the second metal nitride pattern 454 and the fourth metal pattern 484 may have reduced resistances, respectively.

Even if the first and second metal nitride patterns 452 and 454 have thin thicknesses, they may have the enhanced barrier characteristics, and thus the second and fourth metal patterns 482 and 484 may be compactly formed with no defects therein. Additionally, an amount of fluorine permeating into the first and second third metal patterns 442 and 444 may be very small, and thus no defects such as void or seam may be formed in an interface between the first metal pattern 442 and the first insulating interlayer 420 or an interface between the third metal pattern 444 and the first insulating interlayer 420. Accordingly, the first contact plug 492 including the first and second metal patterns 442 and 482 or the second contact plug 494 including the third and fourth metal patterns 444 and 484 may have good characteristics.

Particularly, each of the first and second source/drain layers 302 and 304 may be formed by a SEG process, and in some cases, upper surfaces thereof may not be completely flat and/or smooth, and the first and second metal silicide patterns 472 and 474 may not have good surface characteristics. Additionally, the first and second metal nitride patterns 452 and 454 on the first and second metal silicide patterns 472 and 474, respectively, may not be uniformly deposited thereon, and thus may not have good characteristics, e.g., poor adhesion characteristics to the first and second metal silicide patterns 472 and 474 increasing the resistance between the first and second source/drain layers 302 and 304 and the first and second contact plugs 492 and 494. However, in the inventive concepts, the characteristics of the first and second metal nitride patterns 452 and 454, which may be included in the first and second contact plugs 492 and 494, respectively, serving as contact plugs electrically connecting the first and second source/drain layers 302 and 304 to the wirings in the finFET, may be enhanced through the above-described nitridation process.

Figure 38B:
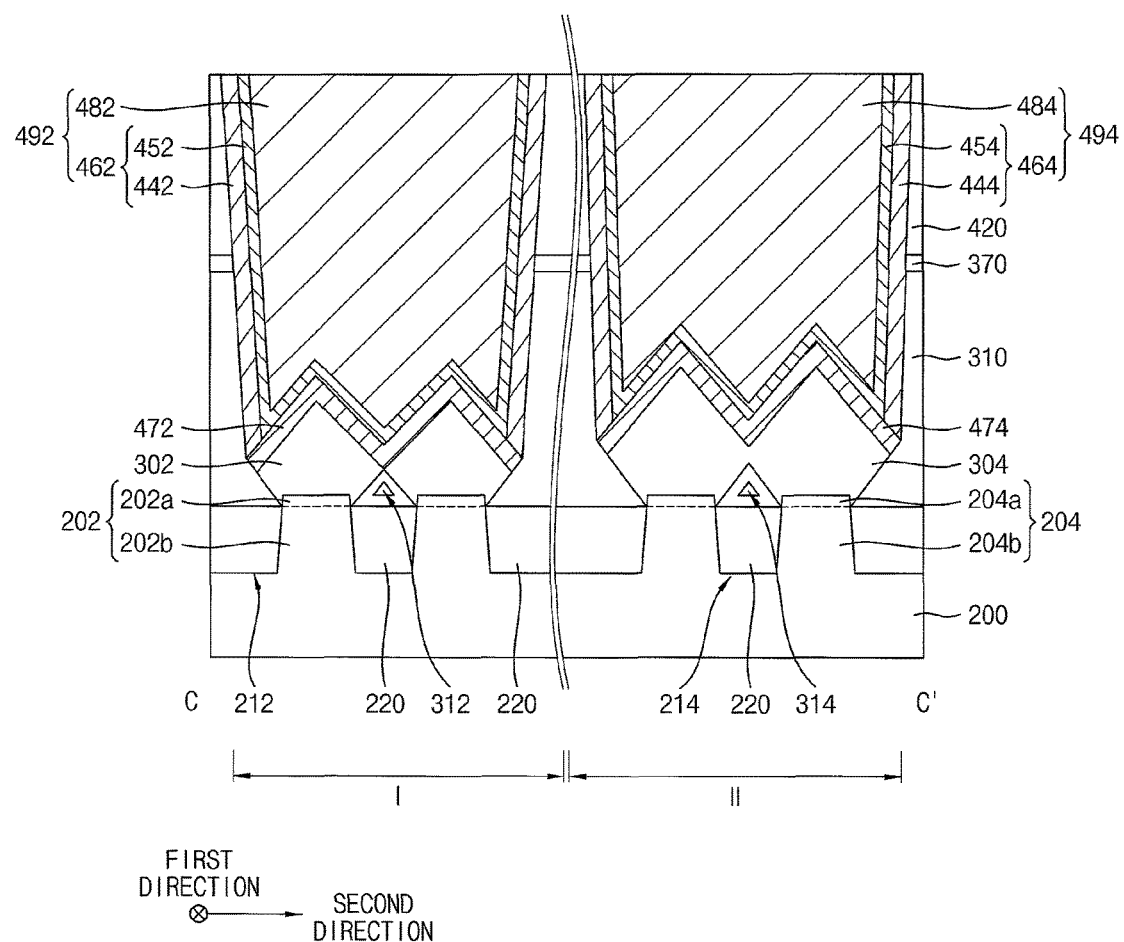

Referring to FIG. 38B, as illustrated with reference to FIGS. 22 to 24, the first and second source/drain layers 302 and 304 may have different heights from each other, and thus the first and second metal silicide patterns 472 and 474 on the first and second source/drain layers 302 and 304, respectively, may have different heights from each other. As a result, bottoms of the first and second contact plugs 492 and 494 contacting upper surfaces of the first and second metal silicide patterns 472 and 474 may have different heights from each other. In example embodiments, the bottom of the second contact plug 494 in the second region II may be higher than that of the first contact plug 492 in the first region I.

Figure 39:
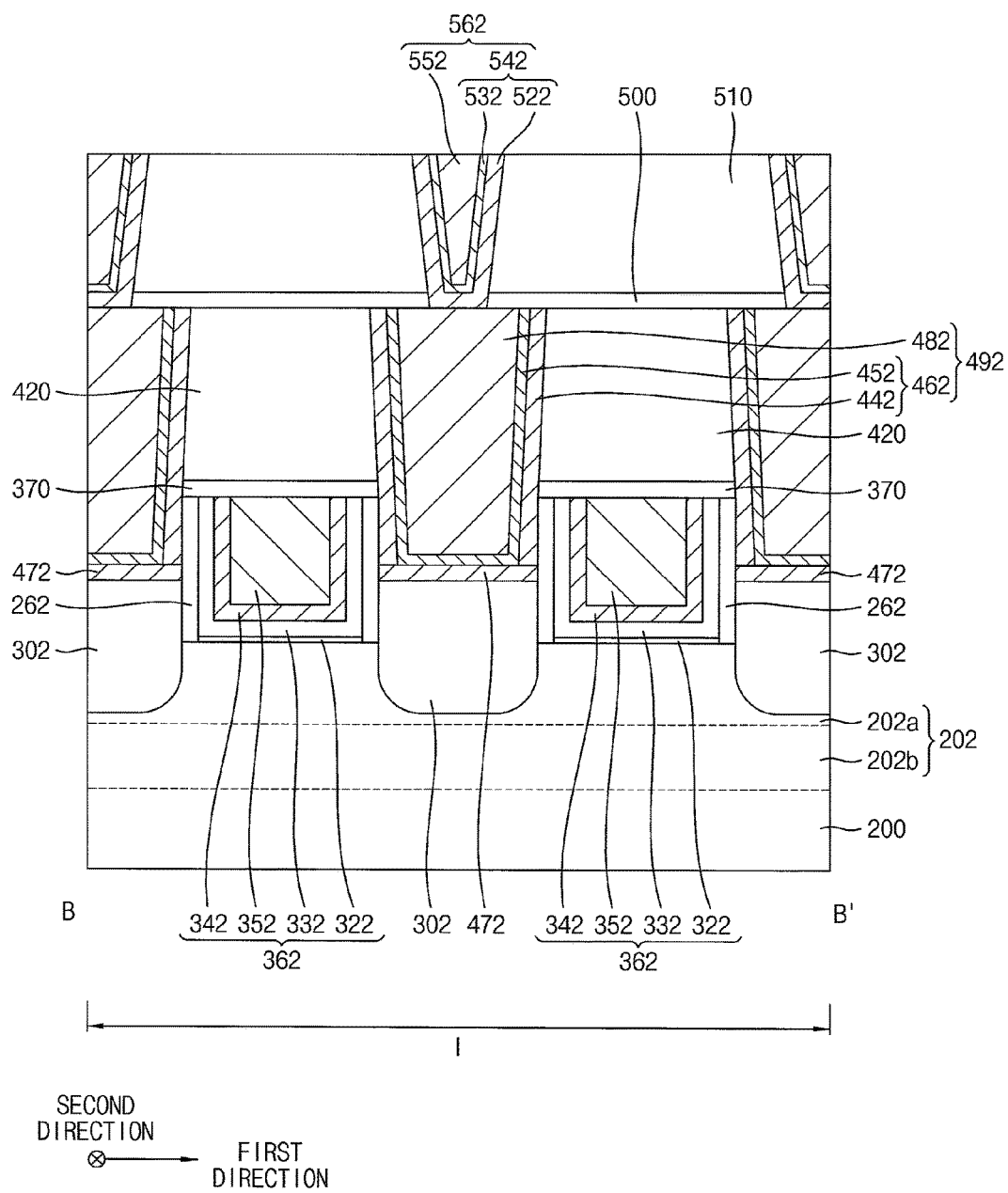

Referring to FIG. 39, a first etch stop layer 500 and a second insulating interlayer 510 may be sequentially formed on the first insulating interlayer 420 and the first and second contact plugs 492 and 494, and a third contact plug 562 may be formed through the second insulating interlayer 510 and the first etch stop layer 500 to contact upper surfaces of the first and second contact plugs 492 and 494.

In example embodiments, the third contact plug 562 may be formed by a single damascene process, however, the inventive concepts may not be limited thereto, and for example, may be formed by a dual damascene process.

When the third contact plug 562 is formed by a single damascene process, a third contact hole (not shown) may be formed through the second insulating interlayer 510 and the first etch stop layer 500 to expose the upper surfaces of the first and second contact plugs 492 and 494, a third metal layer and a second metal nitride layer may be sequentially formed on the exposed upper surfaces of the first and second contact plugs 492 and 494, a sidewall of the third contact hole, and an upper surface of the second insulating interlayer 510, and a fourth metal layer may be formed on the second metal nitride layer to fill a remaining portion of the third contact hole. The fourth metal layer, the second metal nitride layer and the third metal layer may be planarized until the upper surface of the second insulating interlayer 510 may be exposed to form the third contact plug 562 contacting the upper surfaces of the first and second contact plugs 492 and 494 and filling the third contact hole.

The third metal layer may be formed of a metal, e.g., titanium, tantalum, etc., and the second metal nitride layer may be formed of a metal nitride, e.g., titanium nitride, tantalum nitride, tungsten nitride, etc. The fourth metal layer may be formed of a metal, e.g., tungsten, copper, aluminum, etc.

In example embodiments, a nitridation process may be further performed on the second metal nitride layer after forming the third metal layer and the second metal nitride layer. For example, when no heat treatment process is performed after the third metal layer and the second metal nitride layer are formed, the nitridation process may not be necessary. Particularly, when the fourth metal layer is formed of a material except for tungsten, e.g., copper, aluminum, etc., the nitridation process may not be performed.

The third contact plug 562 may include a third barrier pattern 542 and a sixth metal pattern 552, and the third barrier pattern 542 may include a fifth metal pattern 522 and a third metal nitride pattern 532. The third metal nitride pattern 532 may contact an upper surface of the fifth metal pattern 522, and may cover a bottom and a sidewall of the sixth metal pattern 552. The fifth metal pattern 522 may contact an upper surface of the first contact plug 492 or an upper surface of the second contact plug 494, and may cover an outer sidewall of the third metal nitride pattern 532.

Figure 40:
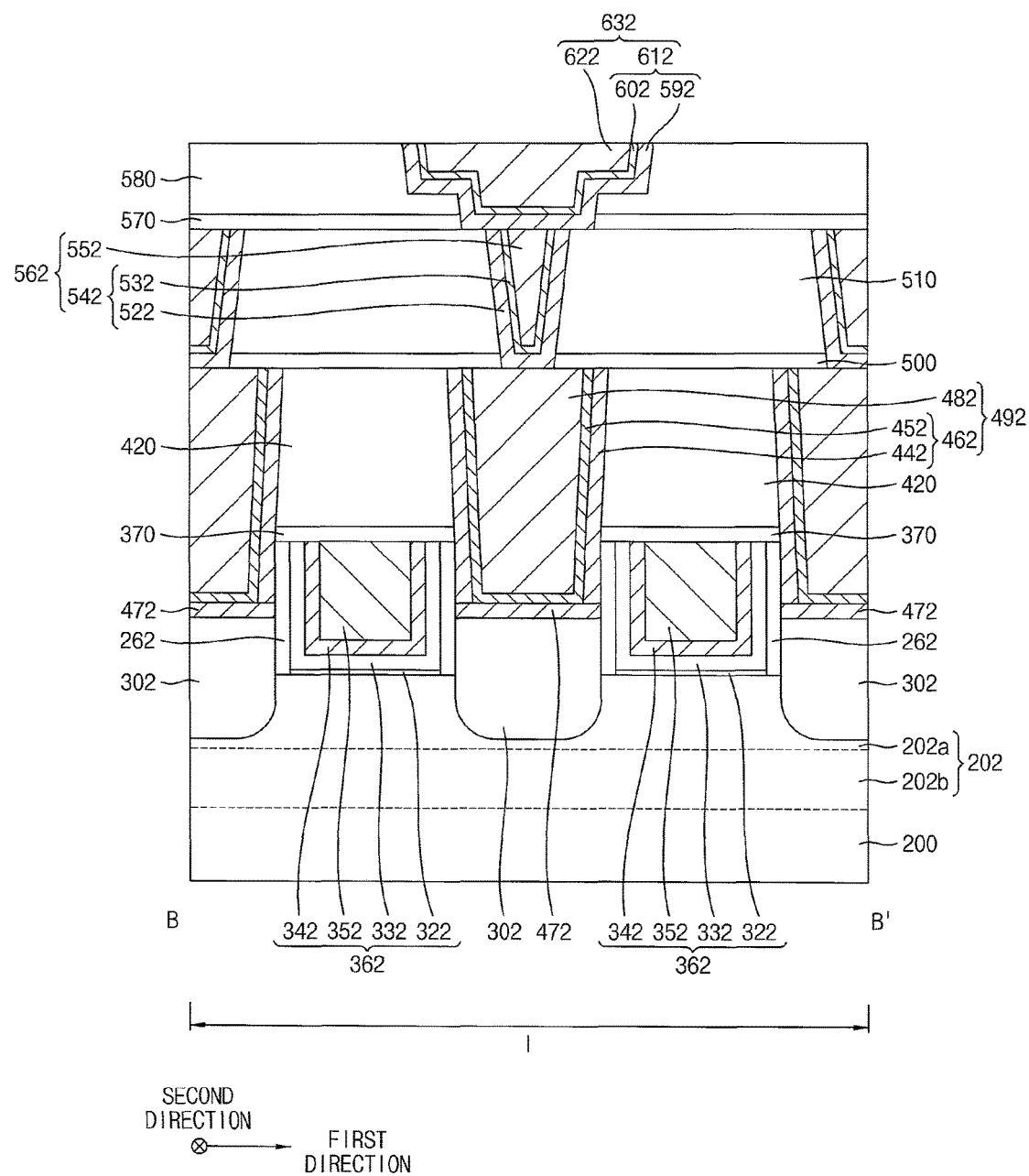

Referring to FIG. 40, a second etch stop layer 570 and a third insulating interlayer 580 may be sequentially formed on the second insulating interlayer 510 and the third contact plug 562, and a wiring structure 632 may be formed therethrough to contact an upper surface of the third contact plug 562.

In example embodiments, the wiring structure 632 may be formed by a dual damascene process, however, may not be limited thereto, and for example, may be formed by a single damascene process.

When the wiring structure 632 is formed by a dual damascene process, first and second etching masks (not shown) may be formed on the third insulating interlayer 580, an upper portion of the third insulating interlayer 580 may be partially etched using the first and second etching masks, and the third insulating interlayer 580 may be etched after removing the second etching mask to form a via hole (not shown) penetrating through a lower portion of the third insulating interlayer 580 and exposing an upper surface of the third contact plug 562, and a trench (not shown) penetrating through an upper portion of the third insulating interlayer 580 and being in communication with the via hole. A fifth metal layer and a third metal nitride layer may be sequentially formed on the exposed upper surface of the third contact plug 562, sidewalls and bottoms of the via hole and the trench, and an upper surface of the third insulating interlayer 580, and a sixth metal layer may be formed on the third metal nitride layer to fill remaining portions of the via hole and the trench. The sixth metal layer, the third metal nitride layer and the fifth metal layer may be planarized until the upper surface of the third insulating interlayer 580 may be exposed to form the wiring structure 632 contacting the exposed upper surface of the third contact plug 562 and filling the via hole and the trench.

The fifth metal layer may be formed of a metal, e.g., titanium, tantalum, etc., and the third metal nitride layer may be formed of a metal nitride, e.g., titanium nitride, tantalum nitride, tungsten nitride, etc. The sixth metal layer may be formed of a metal, e.g., copper, aluminum, tungsten, etc.

Like the second metal nitride layer, a nitridation process on the third metal nitride layer may not be necessary.

The wiring structure 632 may include a fourth barrier pattern 612 and an eighth metal pattern 622, and the fourth barrier pattern 612 may include a seventh metal pattern 592 and a fourth metal nitride pattern 602. The fourth metal nitride pattern 602 may contact an upper surface of the third contact plug 562, and may cover a bottom and a sidewall of the eighth metal pattern 622. The eighth metal pattern 622 may contact an upper surface of the third contact plug 562, and may cover an outer sidewall of the fourth metal nitride pattern 602.

The semiconductor device may be manufactured by the above processes.

The above semiconductor device and the method of manufacturing the same may be applied to various types of memory devices including contact plugs and/or wirings and methods of manufacturing the same. For example, the semiconductor device may be applied to contact plugs and/or wirings of logic devices such as central processing units (CPUs), main processing units (MPUs), or application processors (APs), or the like. Additionally, the semiconductor device may be applied to contact plugs and/or wirings of volatile memory devices such as DRAM devices or SRAM devices, or contact plugs and/or wirings of non-volatile memory devices such as flash memory devices, PRAM devices, MRAM devices, RRAM devices, or the like.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present disclosure. Accordingly, all such modifications are intended to be included within the scope of the present disclosure as defined in the claims. In the claims, means-plus-function clauses are intended to cover the structures described herein as performing the recited function and not only structural equivalents but also equivalent structures. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A semiconductor device, comprising:
   an active fin partially protruding from an isolation pattern on a substrate;
   a gate structure on the active fin;
   a source/drain layer on a portion of the active fin adjacent to the gate structure;
   a metal silicide pattern on the source/drain layer; and
   a plug on the metal silicide pattern, the plug including:
      a second metal pattern;
      a metal nitride pattern contacting an upper surface of the metal silicide pattern and covering a bottom and a sidewall of the second metal pattern; and
      a first metal pattern contacting an upper surface of the metal silicide pattern and covering an outer sidewall of the metal nitride pattern,
      wherein the metal silicide pattern and the first metal pattern include substantially the same metal,
   wherein the gate structure includes a plurality of gate structures disposed in a direction, and the source/drain layer is formed on a portion of the active fin between neighboring ones of the plurality of gate structures in the direction, further comprising a gate spacer covering a sidewall of each of the plurality of gate structures, and
   wherein the plug is formed between the gate spacers on sidewalls of neighboring ones of the plurality of gate structures in the direction, and an outer sidewall of the first metal pattern of the plug contacts outer sidewalls of the gate spacers.

2. The semiconductor device of claim 1, wherein the source/drain layer fills a recess on a portion of the active fin adjacent to the gate structure and protrudes from the recess, and an uppermost surface of the source/drain layer is higher than that of the active fin.

3. The semiconductor device of claim 2, further comprising a gate spacer covering a sidewall of the gate structure,
   wherein the source/drain layer contacts an outer sidewall of the gate spacer.

4. The semiconductor device of claim 1, wherein the gate structure includes:
   a gate electrode; and
   a gate insulation pattern on the active fin, the gate insulation pattern covering a bottom and a sidewall of the gate electrode.

5. The semiconductor device of claim 4, wherein the gate structure further includes:
   an interface pattern between the active fin and the gate insulation pattern; and
   a work function control pattern between the gate insulation pattern and the gate electrode, the work function control pattern covering a bottom and a sidewall of the gate electrode.

6. The semiconductor device of claim 1, wherein the second metal pattern includes tungsten, the first metal pattern includes titanium, cobalt or nickel, the metal silicide pattern includes titanium silicide, cobalt silicide or nickel silicide, and the metal nitride pattern includes titanium nitride, tantalum nitride or tungsten nitride.

7. The semiconductor device of claim 1, wherein the first metal pattern includes titanium nitride, cobalt nitride or nickel nitride, and the metal nitride pattern includes titanium nitride, tantalum nitride or tungsten nitride, and
   wherein a nitrogen concentration of the first metal pattern is lower than that of the metal nitride pattern.

8. The semiconductor device of claim 7, wherein the nitrogen concentration of the first metal pattern gradually decreases according to a distance from the outer sidewall of the metal nitride pattern.

9. The semiconductor device of claim 1, wherein a nitrogen concentration of the metal nitride pattern decreases from a top toward a bottom thereof.

10. The semiconductor device of claim 1, wherein the metal nitride pattern has a thickness of equal to or less than about 3 nm, and the first metal pattern has a thickness of about 1 nm to about 10 nm.

11. A semiconductor device, comprising:
    an active fin partially protruding from an isolation pattern on a substrate;
    a gate structure on the active fin;
    a source/drain layer on a portion of the active fin adjacent to the gate structure;
    a metal silicide pattern on the source/drain layer; and
    a plug on the metal silicide pattern, the plug including:
       a second metal pattern;
       a metal nitride pattern contacting an upper surface of the metal silicide pattern and covering a bottom and a sidewall of the second metal pattern; and
       a first metal pattern contacting an upper surface of the metal silicide pattern and covering an outer sidewall of the metal nitride pattern,
       wherein the metal silicide pattern and the first metal pattern include substantially the same metal,
    wherein the source/drain layer includes:
       a first source/drain layer including single crystalline silicon-germanium; and
       a second source/drain layer including single crystalline silicon or single crystalline silicon carbide,
       wherein an uppermost surface of the second source/drain layer is higher than that of the first source/drain layer.

12. The semiconductor device of claim 11, wherein the plug further includes:
    a first plug on the first source/drain layer; and
    a second plug on the second source/drain layer,
    wherein a bottom of the second plug is lower than that of the first plug.

13. A semiconductor device, comprising:
    an active fin partially protruding from an isolation pattern on a substrate;
    a gate structure on the active fin;
    a source/drain layer on a portion of the active fin adjacent to the gate structure;
    a metal silicide pattern on the source/drain layer; and
    a plug on the metal silicide pattern, the plug including:
       a second metal pattern;
       a metal nitride pattern contacting an upper surface of the metal silicide pattern and covering a bottom and a sidewall of the second metal pattern; and
       a first metal pattern on the metal silicide pattern, the first metal pattern covering an outer sidewall of the metal nitride pattern,
       wherein the first metal pattern includes a metal nitride, a nitrogen concentration of the first metal pattern gradually decreasing according to a distance from the outer sidewall of the metal nitride pattern.

14. The semiconductor device of claim 13, wherein the first metal pattern includes titanium nitride, cobalt nitride or nickel nitride, and the metal nitride pattern includes titanium nitride, tantalum nitride or tungsten nitride, and
    wherein the nitrogen concentration of the first metal pattern is lower than that of the metal nitride pattern.

15. The semiconductor device of claim 13, wherein an upper surface of the source/drain layer is not flat and/or smooth.

16. The semiconductor device of claim 13, wherein the source/drain layer fills a recess on a portion of the active fin adjacent to the gate structure and protrudes from the recess, and an uppermost surface of the source/drain layer is higher than that of the active fin.

17. The semiconductor device of claim 16, wherein the source/drain layer includes:
   a first source/drain layer including single crystalline silicon-germanium; and
   a second source/drain layer including single crystalline silicon or single crystalline silicon carbide,
   wherein an uppermost surface of the second source/drain layer is higher than that of the first source/drain layer.

18. The semiconductor device of claim 17, wherein the plug includes:
   a first plug on the first source/drain layer; and
   a second plug on the second source/drain layer,
   wherein a bottom of the second plug is lower than that of the first plug.

* * * * *